US012567862B2

(12) United States Patent
Ma et al.

(10) Patent No.: US 12,567,862 B2
(45) Date of Patent: Mar. 3, 2026

(54) LEVEL SHIFTING CIRCUIT MANUFACTURING METHOD

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Yaqi Ma, Hsinchu (TW); Lei Pan, Hsinchu (TW); JunKui Hu, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 18/790,551

(22) Filed: Jul. 31, 2024

(65) Prior Publication Data

US 2024/0396553 A1      Nov. 28, 2024

Related U.S. Application Data

(60) Continuation of application No. 18/447,154, filed on Aug. 9, 2023, now Pat. No. 12,149,243, which is a
(Continued)

(30) Foreign Application Priority Data

Jul. 13, 2021      (CN) .......................... 202110787741.9

(51) Int. Cl.
| | |
|---|---|
| *H10D 84/85* | (2025.01) |
| *G06F 30/392* | (2020.01) |
(Continued)

(52) U.S. Cl.
CPC ... *H03K 19/018521* (2013.01); *G06F 30/392* (2020.01); *H03K 3/35613* (2013.01); *H03K 19/0185* (2013.01); *H10D 84/85* (2025.01)

(58) Field of Classification Search
CPC . H10D 84/85; H03K 19/0185–018528; H03K 3/0375; H03K 3/35613
See application file for complete search history.

(56) References Cited

U.S. PATENT DOCUMENTS

| | | | |
|---|---|---|---|
| 7,260,442 B2 | 8/2007 | Hwang et al. | |
| RE42,494 E | 6/2011 | Teggatz | |
(Continued)

FOREIGN PATENT DOCUMENTS

| | | |
|---|---|---|
| CN | 101207380 | 12/2012 |
| CN | 110620577 | 12/2019 |
(Continued)

OTHER PUBLICATIONS

Office Action dated May 14, 2022 for corresponding case No. DE 10 2021 119 369.9 (p. 1).
(Continued)

*Primary Examiner* — Patrick O'Neill
(74) *Attorney, Agent, or Firm* — Hauptman Ham, LLP

(57) ABSTRACT

A method of generating an integrated circuit (IC) layout diagram includes defining first through fourth PMOS transistors in an n-well region, arranging a plurality of conductive regions whereby a bias circuit is configured to include the first and second PMOS transistors and a level shifter is configured to include the third and fourth PMOS transistors, and arranging a plurality of conductive elements whereby a first power domain includes electrical connections to each of the first and third PMOS transistors and a second power domain includes electrical connections to each of the second and fourth PMOS transistors.

20 Claims, 9 Drawing Sheets

Related U.S. Application Data division of application No. 17/883,257, filed on Aug. 8, 2022, now Pat. No. 11,831,310, which is a continuation of application No. 17/384,409, filed on Jul. 23, 2021, now Pat. No. 11,431,339.

(51) Int. Cl.
*H03K 3/356* (2006.01)
*H03K 19/0185* (2006.01)

(56) References Cited

U.S. PATENT DOCUMENTS

| | | | |
|---|---|---|---|
| 9,256,709 B2 | 2/2016 | Yu et al. | |
| 11,431,339 B1 | 8/2022 | Ma et al. | |
| 11,831,310 B2 | 11/2023 | Ma | |
| 12,149,243 B2 * | 11/2024 | Ma .................. | H03K 19/0185 |
| 2008/0143418 A1 | 6/2008 | Lu et al. | |
| 2012/0086495 A1 | 4/2012 | Chen et al. | |
| 2014/0040838 A1 | 2/2014 | Liu et al. | |

| | | |
|---|---|---|
| 2014/0132329 A1 | 5/2014 | Li et al. |
| 2015/0278429 A1 | 10/2015 | Chang |
| 2022/0103170 A1 | 3/2022 | Liberti et al. |

FOREIGN PATENT DOCUMENTS

| | | |
|---|---|---|
| EP | 2680104 | 1/2014 |
| EP | 3499720 | 6/2019 |
| JP | H09130231 | 5/1997 |
| JP | 2008236720 | 10/2008 |
| KR | 20030042118 | 5/2003 |
| KR | 2010016050 | 2/2010 |
| TW | 1652900 | 3/2019 |

OTHER PUBLICATIONS

Office Action dated Jun. 7, 2022 for corresponding case No. TW 11120562610. (pp. 1-11).
Notice of Allowance of Patent dated Jun. 21, 2023 from corresponding application No. KR 10-2022-0011743. (pp. 1-9).

\* cited by examiner

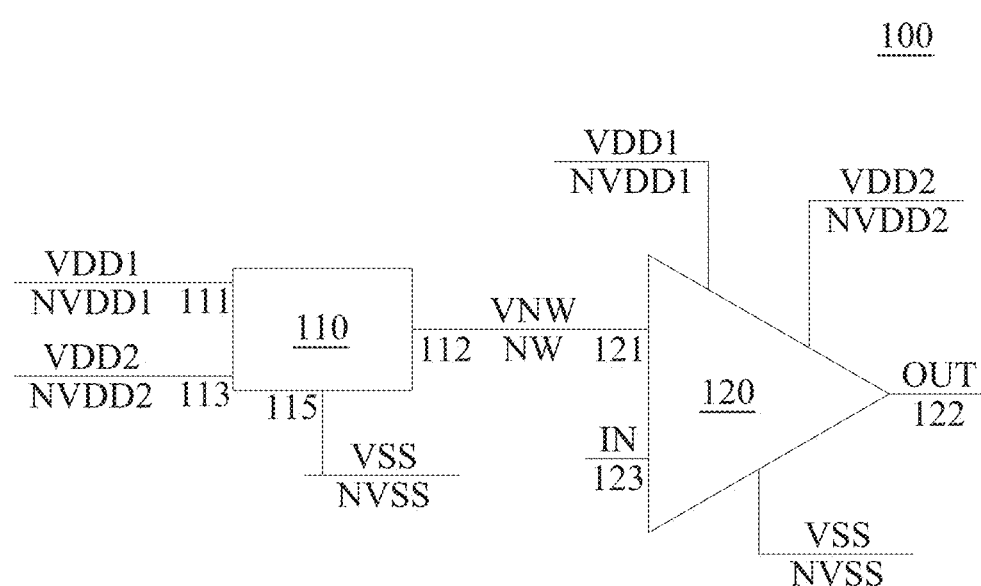
Fig. 1A
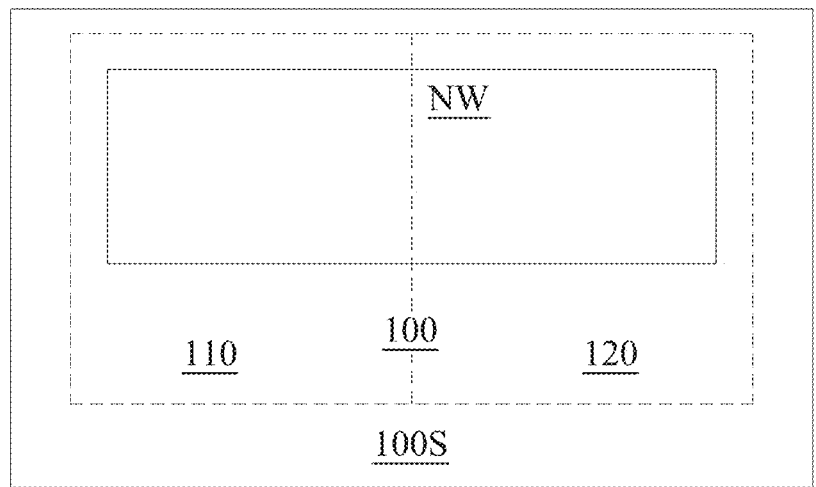
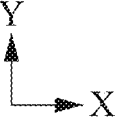
Fig. 1B

300

400

500

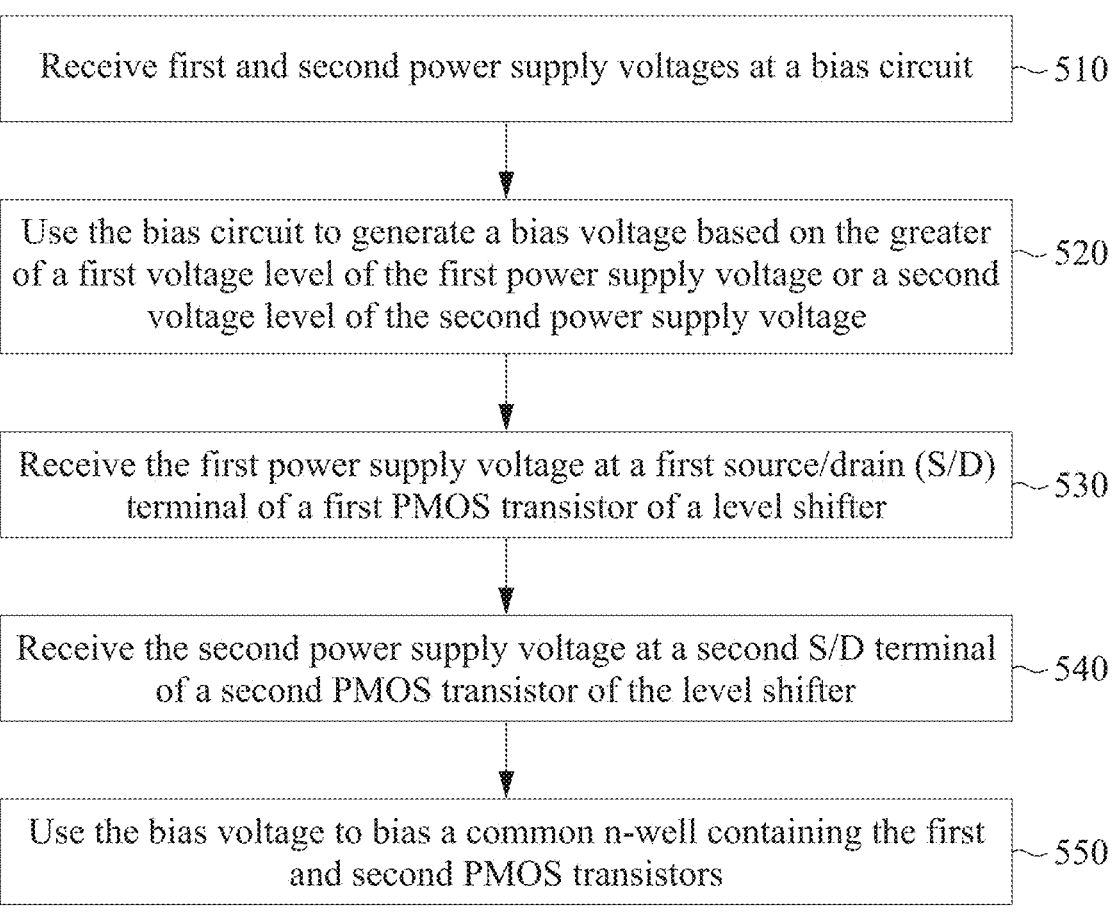

Receive first and second power supply voltages at a bias circuit ~510

Use the bias circuit to generate a bias voltage based on the greater of a first voltage level of the first power supply voltage or a second voltage level of the second power supply voltage ~520

Receive the first power supply voltage at a first source/drain (S/D) terminal of a first PMOS transistor of a level shifter ~530

Receive the second power supply voltage at a second S/D terminal of a second PMOS transistor of the level shifter ~540

Use the bias voltage to bias a common n-well containing the first and second PMOS transistors ~550

Fig. 5

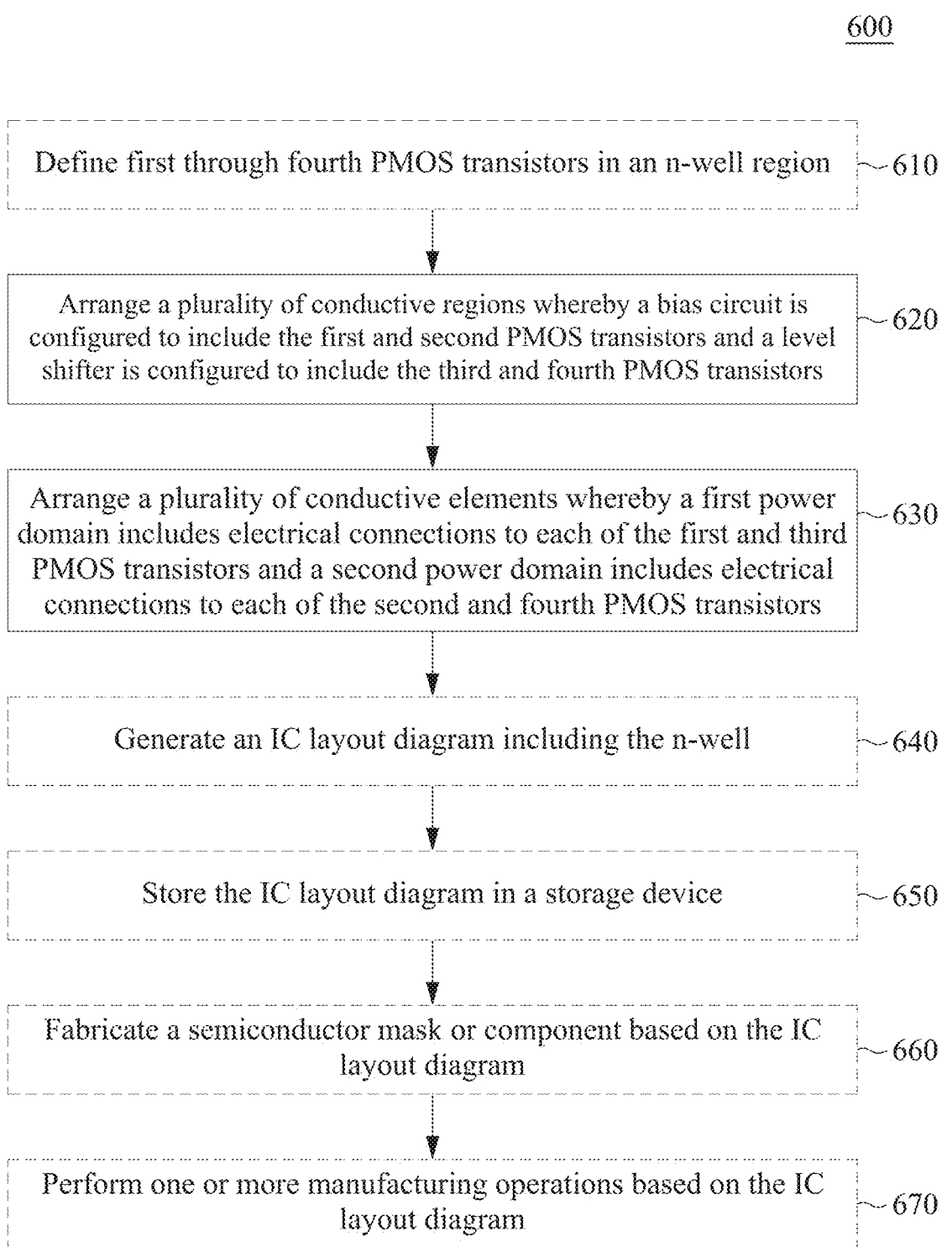

600

Define first through fourth PMOS transistors in an n-well region ~610

Arrange a plurality of conductive regions whereby a bias circuit is configured to include the first and second PMOS transistors and a level shifter is configured to include the third and fourth PMOS transistors ~620

Arrange a plurality of conductive elements whereby a first power domain includes electrical connections to each of the first and third PMOS transistors and a second power domain includes electrical connections to each of the second and fourth PMOS transistors ~630

Generate an IC layout diagram including the n-well ~640

Store the IC layout diagram in a storage device ~650

Fabricate a semiconductor mask or component based on the IC layout diagram ~660

Perform one or more manufacturing operations based on the IC layout diagram ~670

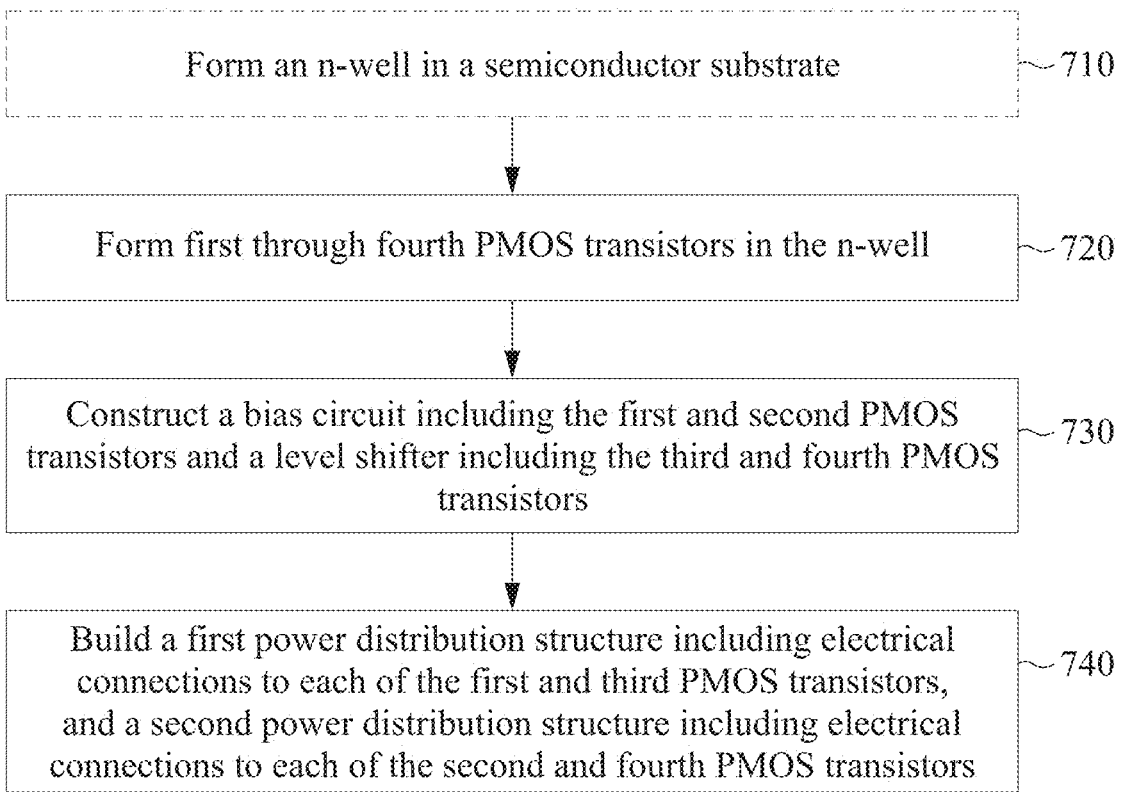

Form an n-well in a semiconductor substrate    ~710

Form first through fourth PMOS transistors in the n-well    ~720

Construct a bias circuit including the first and second PMOS transistors and a level shifter including the third and fourth PMOS transistors    ~730

Build a first power distribution structure including electrical connections to each of the first and third PMOS transistors, and a second power distribution structure including electrical connections to each of the second and fourth PMOS transistors    ~740

Processor
802

Network
Interface
812

Network
814

Memory
804

Instructions
806

Layout Library
807

User Interface
(UI)
842

LEVEL SHIFTING CIRCUIT MANUFACTURING METHOD

PRIORITY CLAIM

The present application is a continuation of U.S. application Ser. No. 18/447,154, filed Aug. 9, 2023, now U.S. Pat. No. 12,149,243, issued Nov. 19, 2024, which is a divisional of U.S. application Ser. No. 17/883,257, filed Aug. 8, 2022, now U.S. Pat. No. 11,831,310, issued Nov. 28, 2023, which is a continuation of U.S. application Ser. No. 17/384,409, filed Jul. 23, 2021, now U.S. Pat. No. 11,431,339, issued Aug. 30, 2022, which claims the priority of China Application No. 202110787741.9, filed Jul. 13, 2021, each of which is incorporated herein by reference in its entirety.

BACKGROUND

Integrated circuits (ICs) sometimes include multiple portions corresponding to independently controlled power domains. In some cases, a first power domain has a first power supply voltage level and a second power domain has a second power supply voltage level different from the first power supply voltage level. Signals are often propagated between such portions using level shifters that shift logical levels between the first and second power supply voltage levels.

To be capable of shifting the logical levels, level shifters typically include both n-type metal-oxide-semiconductor (NMOS) and p-type metal-oxide-semiconductor (PMOS) transistors that operate in both the first and second power domains.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are diagrams of a level shifting circuit, in accordance with some embodiments.

FIG. 5 is a diagram of a method of operating a level shifting circuit, in accordance with some embodiments.

FIG. 6 is a diagram of a method of generating an IC layout diagram, in accordance with some embodiments.

FIG. 7 is diagram of a method of manufacturing a level shifting circuit, in accordance with some embodiments.

DETAILED DESCRIPTION

Figure 2:
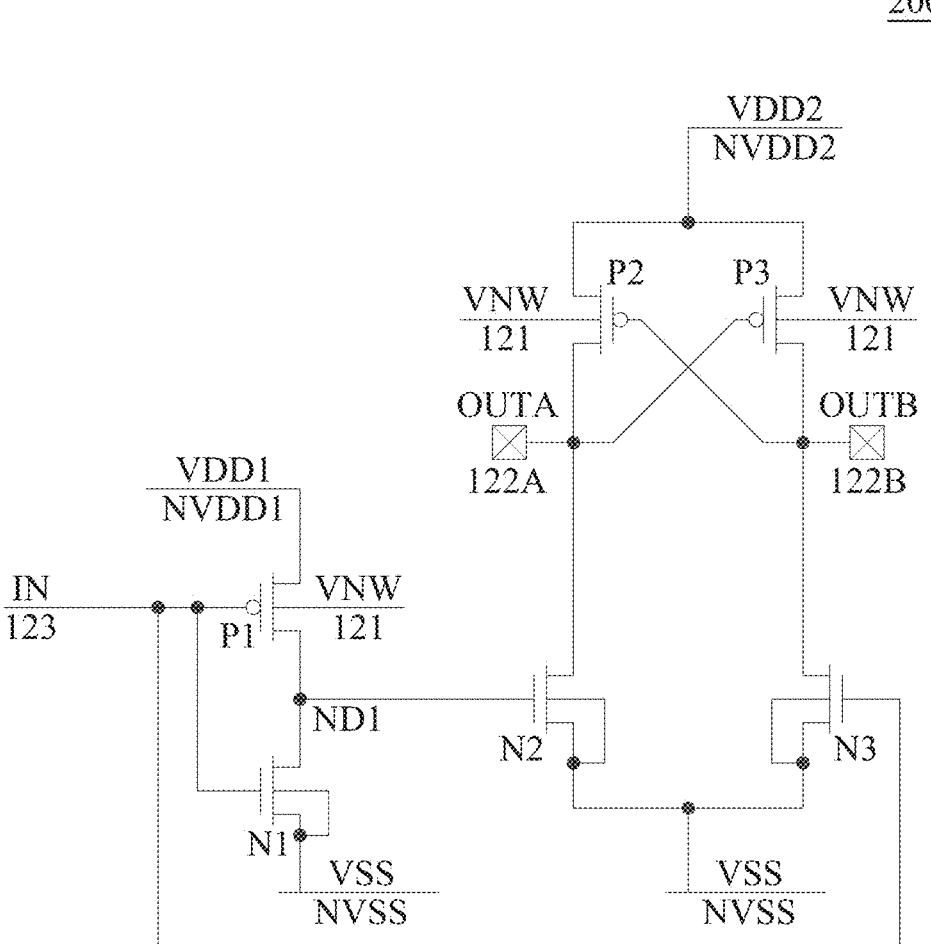
FIG. 2 is a diagram of a level shifter, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A level shifting circuit includes a bias circuit and a level shifter including first and second PMOS transistors. The first and second PMOS transistors are positioned in a common n-well and configured to operate in respective first and second power domains. The bias circuit is configured to bias the common n-well based on the greater of a first voltage level of the first power domain or a second voltage level of the second power domain. By including the bias circuit configured to bias the common n-well, the level shifting circuit is capable of avoiding latch-up risks while having reduced space requirements compared to approaches in which level shifters include PMOS transistors configured to operate in separate power domains and positioned in separately biased n-wells.

FIGS. 1A and 1B are diagrams of a level shifting circuit 100, in accordance with some embodiments. FIG. 1A is a schematic diagram of level shifting circuit 100, and FIG. 1B is a plan view of level shifting circuit 100 including an X direction and a Y direction perpendicular to the X direction.

Level shifting circuit 100, also referred to as circuit 100 or IC 100 in some embodiments, is an IC configured to operate in first and second power domains (not labeled). The first power domain includes a first power distribution structure including a power supply node NVDD1 configured to have a power supply voltage VDD1 and a reference node NVSS configured to have a reference voltage VSS. The second power domain includes a second power distribution structure including the reference node NVSS and a power supply node NVDD2 configured to have a power supply voltage VDD2 separate from power supply voltage VDD1.

Each of the first and second power domains is capable of operating in a power-on mode or a power-down mode. In the power-on mode, power supply voltage VDD1 on power supply node NVDD1 has a first power supply voltage level of the first power domain, and power supply voltage VDD2 on power supply node NVDD2 has a second power supply voltage level of the second power domain. In the power-down mode, each of power supply voltage VDD1 on power supply node NVDD1 and power supply voltage VDD2 on power supply node NVDD2 has a reference voltage level, e.g., a ground voltage level, of reference voltage VSS on reference node NVSS. A voltage, e.g., power supply voltage VDD1, is considered to have a given voltage level, e.g., the first power supply voltage level, by having a voltage level at or near the given voltage level.

In various embodiments, the first power supply voltage level is less than, equal to, or greater than the second power supply voltage level.

As depicted in FIG. 1A, level shifting circuit 100 includes a bias circuit 110 coupled to a level shifter 120. Bias circuit 110 includes an input terminal 111 coupled to power supply node NVDD1, an input terminal 113 coupled to power supply node NVDD2, an input terminal 115 coupled to reference node NVSS, and an output terminal 112 coupled to an n-well NW. In some embodiments, bias circuit 110 does not include input terminal 115 coupled to reference node NVSS.

As depicted in FIG. 1B, level shifting circuit 100 is positioned in a substrate region 100S including n-well NW. A substrate region, e.g., substrate region 100S, is some or all of a semiconductor wafer, e.g., a silicon (Si) wafer or an epitaxial Si layer, suitable for forming one or more IC devices. In some embodiments, a substrate region includes a p-type semiconductor, e.g., Si, including one or more acceptor dopants, e.g., boron (B) or aluminum (Al). An n-well, e.g., n-well NW, is a portion of the semiconductor wafer positioned within the substrate region and including an n-type semiconductor, e.g., Si, including one or more donor dopants, e.g., phosphorous (P) or arsenic (As).

Level shifter 120 includes an input terminal 121 coupled to n-well NW, an input terminal 123, an output terminal 122, and is coupled to each of power supply nodes NVDD1 and NVDD2 and reference node NVSS.

Two or more circuit elements are considered to be coupled based on one or more direct electrical connections and/or one or more indirect electrical connections that include one or more logic devices, e.g., an inverter or logic gate, between the two or more circuit elements. In some embodiments, electrical communications between the two or more coupled circuit elements are capable of being modified, e.g., inverted or made conditional, by the one or more logic devices.

Bias circuit 110 is thereby configured to receive power supply voltage VDD1 at input terminal 111, power supply voltage VDD2 at input terminal 113, and reference voltage VSS at input terminal 115, if present.

Bias circuit 110 is an electronic circuit including two or more transistors (not shown in FIGS. 1A and 1B), e.g., PMOS transistors P4 and P5 discussed below with respect to FIGS. 3A and 3B or PMOS transistors P6-P8 and NMOS transistor N4 discussed below with respect to FIGS. 4A and 4B, and configured to generate a bias voltage VNW at output terminal 112, and thereby at n-well NW, based on a greater of the voltage level of power supply voltage VDD1 or the voltage level of power supply voltage VDD2.

In some embodiments, bias circuit 110 is configured to generate bias voltage VNW having a bias voltage level equal to the greater of the voltage level of power supply voltage VDD1 or the voltage level of power supply voltage VDD2. In some embodiments, bias circuit 110 is configured to generate bias voltage VNW having the bias voltage level equal to a fraction of the greater of the voltage level of power supply voltage VDD1 or the voltage level of power supply voltage VDD2, e.g., a fraction corresponding to the greater voltage level divided by a voltage divider (not shown).

In various embodiments, bias circuit 110 includes a bias circuit 300 discussed below with respect to FIGS. 3A and 3B, or a bias circuit 400 discussed below with respect to FIGS. 4A and 4B.

Level shifter 120 is configured as discussed above to receive power supply voltages VDD1 and VDD2, reference voltage VSS, bias voltage VNW at input terminal 121, and an input signal IN at input terminal 123, and to generate an output signal OUT at output terminal 122 responsive to input signal IN.

Input signal IN is an electronic signal configured to vary between a logically high state corresponding to the voltage level of power supply voltage VDD1 and a logically low state corresponding to the reference voltage level of reference voltage VSS.

Level shifter 120 is an electronic circuit including at least one PMOS transistor (not shown in FIGS. 1A and 1B), e.g., PMOS transistor P1 discussed below with respect to FIG. 2, including a source/drain (S/D) terminal configured to receive power supply voltage VDD1, a gate configured to receive input signal IN, and a bulk terminal coupled to n-well NW, thereby configured to receive bias voltage VNW.

A bulk terminal is a transistor feature corresponding to the substrate region or n-well within which the transistor is positioned. An S/D terminal is one of two features of a given transistor including portions of the substrate region or n-well having a doping type opposite that of the substrate region or n-well, e.g., a p-type S/D terminal of a PMOS transistor positioned in an n-well.

Level shifter 120 includes two or more additional PMOS transistors (not shown in FIGS. 1A and 1B), e.g., PMOS transistors P2 and P3 discussed below with respect to FIG. 2, each including a S/D terminal configured to receive power supply voltage VDD2 and a bulk terminal coupled to n-well NW, thereby configured to receive bias voltage VNW.

In some embodiments, level shifter 120 also includes one or more NMOS transistors (not shown in FIGS. 1A and 1B), e.g., NMOS transistors N1-N3 discussed below with respect to FIG. 2.

Level shifter 120 including the at least one PMOS transistor, the two or more additional PMOS transistors, and the one or more NMOS transistors (if present) is configured to generate output signal OUT responsive to input signal IN and varying between the logically high state corresponding to the voltage level of power supply voltage VDD2 and the logically low state corresponding to the reference voltage level of reference voltage VSS. In some embodiments, output terminal 122 includes two signal paths, and level shifter 120 is configured to generate output signal OUT as a differential signal including complementary components on the signal paths, each component varying between the logically high state corresponding to the voltage level of power supply voltage VDD2 and the logically low state corresponding to the reference voltage level of reference voltage VSS.

In some embodiments, level shifter 120 includes a level shifter 200 discussed below with respect to FIGS. 2A and 2B.

As depicted in FIG. 1B, level shifting circuit 100 includes a portion positioned inside n-well NW and a portion positioned outside of n-well NW. The PMOS transistors of each of bias circuit 110 and level shifter 120 are positioned inside n-well NW, and other elements of bias circuit 110 and/or level shifter 120, e.g., the one or more NMOS transistors, are positioned outside of n-well NW. In some embodiments, level shifting circuit 100 includes one or more circuit elements (not shown) in addition to those included in bias circuit 110 and level shifter 120 positioned inside and/or outside of n-well NW.

By the configuration discussed above, the PMOS transistors of level shifting circuit 100 include diode junctions based on p-type S/D terminals and n-type bulk terminals corresponding to n-well NW. Level shifting circuit 100 includes bias circuit 110 configured to bias n-well NW by continuously generating bias voltage VNW having one or more bias voltage levels sufficiently large to avoid forward biasing the diode junctions of the PMOS transistors of level shifter 120.

In operation, when each of the first and second power domains is operating in the power-on mode, bias circuit 110 generates bias voltage VNW having the bias voltage level based on the greater of power supply voltage VDD1 having the first power supply voltage level or power supply voltage VDD2 having the second power supply voltage level. When the first power domain is operating in the power-on mode and the second power domain is operating in the power-down mode, bias circuit 110 generates bias voltage VNW having the bias voltage level equal to all or a fraction of the first power supply voltage level. When the first power domain is operating in the power-down mode and the second power domain is operating in the power-on mode, bias circuit 110 generates bias voltage VNW having the bias voltage level equal to all or a fraction of the second power supply voltage level.

When each of the first and second power domains is operating in the power-down mode, bias circuit 110 generates bias voltage VNW having the bias voltage level equal to the reference voltage level based on each of power supply voltages VDD1 and VDD2 having the reference voltage level. Because the S/D terminals of each of the PMOS transistors of level shifter 120 also have the reference voltage level based on each of power supply voltages VDD1 and VDD2 having the reference voltage level, forward biasing of the junction diodes of the PMOS transistors is avoided.

In some embodiments, n-well NW is one n-well of a plurality of n-wells NW, the PMOS transistors of level shifting circuit 100 are positioned inside the plurality of n-wells NW, and bias circuit 110 is configured to bias each n-well NW of the plurality of n-wells NW by generating bias voltage VNW as discussed above such that forward biasing the diode junctions of the PMOS transistors of level shifter 120 is avoided.

In various embodiments, each of the single n-well NW and the plurality of n-wells NW configured to be biased by bias voltage VNW generated by bias circuit 110 is referred to as a common n-well of level shifting circuit 100.

In other approaches in which level shifters include PMOS transistors configured to operate in separate power domains and positioned in separately biased n-wells, the separately biased n-wells are spaced apart by minimum distances to reduce latch-up risks based on the separate power domain biasing voltage levels. In embodiments in which the common n-well includes the single n-well NW, n-well spacing is avoided. In embodiments in which the common n-well includes the plurality of n-wells NW, because each n-well of the plurality of n-wells NW is biased by the same bias voltage VNW, n-well spacing is capable of being reduced compared to n-well spacing in such other approaches.

By being configured as discussed above to avoid forward biasing PMOS diode junctions of level shifter 120, level shifting circuit 100 including bias circuit 110 is capable of avoiding latch-up risks while having reduced space requirements compared to approaches in which level shifters include PMOS transistors configured to operate in separate power domains and positioned in separately biased n-wells.

FIG. 2 is a schematic diagram of level shifter 200, in accordance with some embodiments. Level shifter 200 is usable as level shifter 120 discussed above with respect to FIGS. 1A and 1B.

Level shifter 200 includes power supply nodes NVDD1 and NVDD2, reference node NVSS, input terminals 121 and 123, and output terminal 122 represented as signal paths 122A and 122B, discussed above with respect to FIGS. 1A and 1B. Level shifter 200 is thereby configured to receive power supply voltage VDD1 on power supply node NVDD1, power supply voltage VDD2 on power supply node NVDD2, reference voltage VSS on reference node NVSS, bias voltage VNW on input terminal 121, and signal IN on input terminal 123, each discussed above with respect to FIGS. 1A and 1B.

Level shifter 200 also includes PMOS transistors P1-P3, NMOS transistors N1-N3, and a node ND1. PMOS transistor P1, node ND1, and NMOS transistor N1 are coupled in series between power supply node NVDD1 and reference node NVSS, and gates of PMOS transistor P1 and NMOS transistor N1 are coupled to each other and to input terminal 123. PMOS transistor P1 and NMOS transistor N1 are thereby arranged as an inverter configured to, in operation, invert signal IN received at input terminal 123, and output inverted signal IN on node ND1.

PMOS transistor P2, signal path 122A, and NMOS transistor N2 are coupled in series between power supply node NVDD2 and reference node NVSS, a gate of PMOS transistor P2 is coupled to signal path 122B, and a gate of NMOS transistor N2 is coupled to node ND1. PMOS transistor P3, signal path 122B, and NMOS transistor N3 are coupled in series between power supply node NVDD2 and reference node NVSS, a gate of PMOS transistor P3 is coupled to signal path 122A, and a gate of NMOS transistor N3 is coupled to input terminal 123.

PMOS transistors P2 and P3 and NMOS transistors N2 and N3 are thereby configured to, in operation, receive input signal IN at input terminal 123 and inverted input signal IN at node ND1, and generate output signal OUT as complementary components OUTA on signal path 122A and OUTB on signal path 122B, as discussed above with respect to FIGS. 1A and 1B.

A bulk terminal of each of PMOS transistors P1-P3 is coupled to input terminal 121, and is thereby configured to receive bias voltage VNW. In various embodiments, the bulk terminals of PMOS transistors P1-P3 are coupled to a same input terminal 121 coupled to a single n-well NW, and are thereby configured to receive bias voltage VNW, or are coupled to a plurality of input terminals 121 coupled to a plurality of n-wells NW, and are thereby configured to receive bias voltage VNW.

A bulk terminal of each of NMOS transistors N1-N3 is coupled to reference node NVSS, and is thereby configured to receive reference voltage VSS.

By the configuration discussed above, level shifter 200 has properties in accordance with those discussed above with respect to level shifter 120 such that circuit 100 including level shifter 200 is capable of realizing the benefits discussed above with respect to FIGS. 1A and 1B.

Figure 3A:
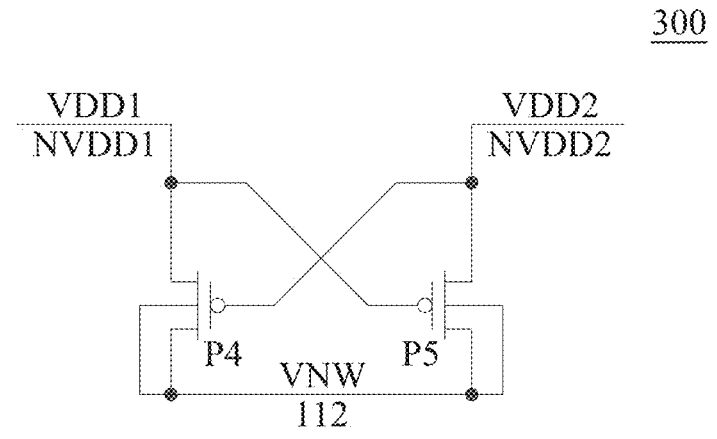
FIG. 3A is a schematic diagram of a bias circuit, in accordance with some embodiments.
Figure 4A:
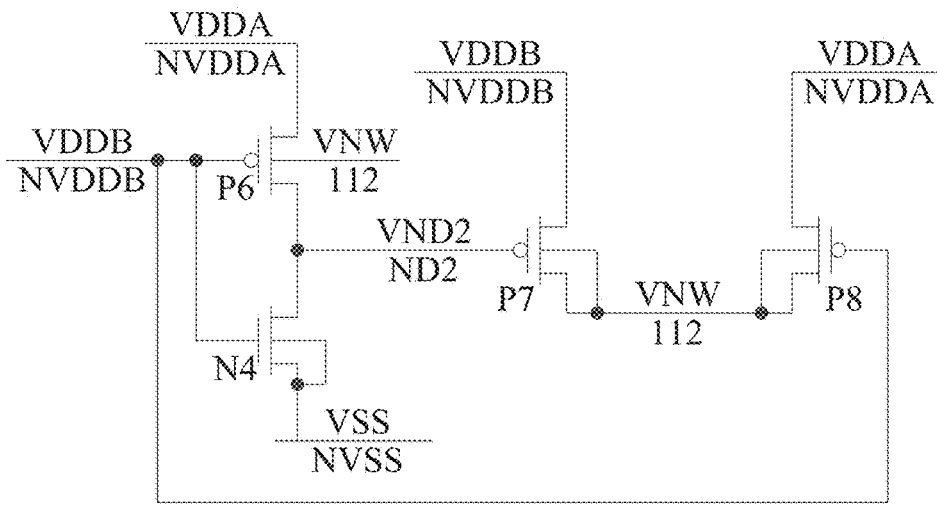
FIG. 4A is a schematic diagram of a bias circuit, in accordance with some embodiments.

FIGS. 3A and 4A are schematic diagrams of respective bias circuits 300 and 400, in accordance with some embodiments. Each of bias circuits 300 and 400 is usable as bias circuit 110 discussed above with respect to FIGS. 1A and 1B.

Figure 3B:
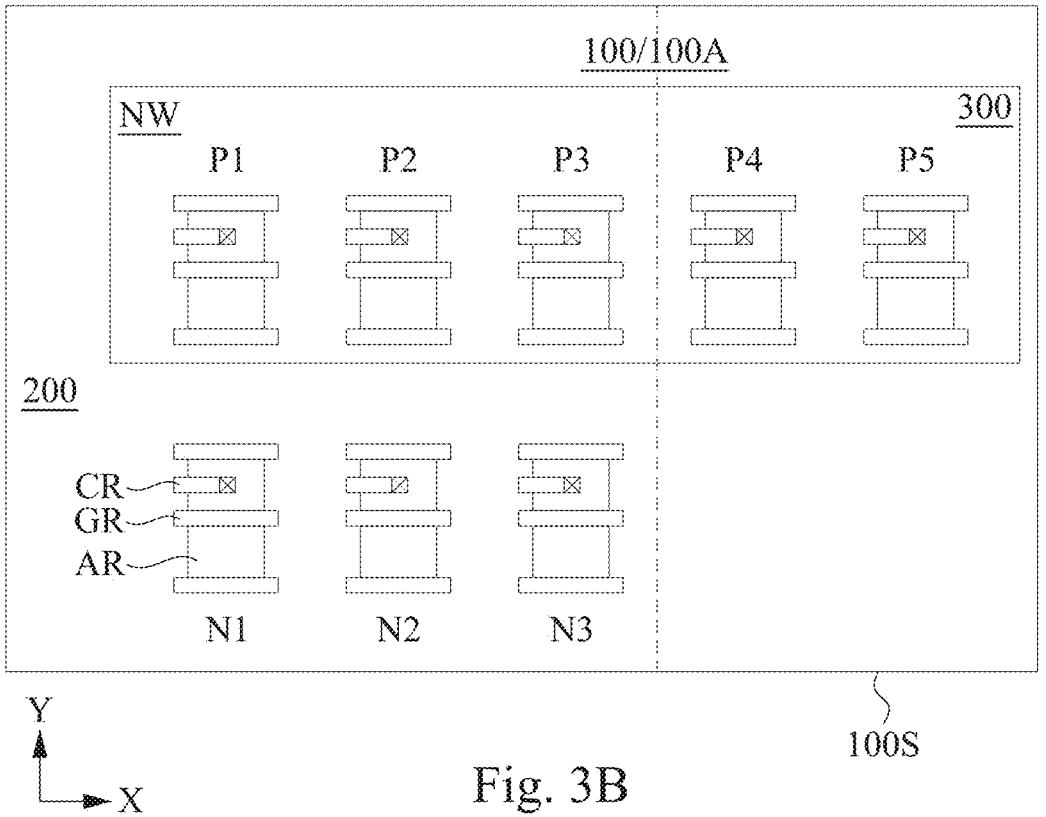
FIG. 3B is a diagram of an IC layout diagram and a level shifting circuit, in accordance with some embodiments.

FIG. 3B is a diagram of an IC layout diagram 100A and a corresponding embodiment of level shifting circuit 100, discussed above with respect to FIGS. 1A and 1B, including level shifter 200, discussed above with respect to FIG. 2, and bias circuit 300, in accordance with some embodiments. FIG. 4B is a diagram of an IC layout diagram 100B and a corresponding embodiment of level shifting circuit 100 including level shifter 200 and bias circuit 400, in accordance with some embodiments. FIGS. 3B and 4B depict plan views of level shifting circuit 100 and respective IC layout diagrams 100A and 100B, and each includes n-well NW positioned in substrate region 100S and the X and Y directions, each discussed above with respect to FIG. 1B.

Each of IC layout diagrams 100A and 100B is a non-limiting example of an IC layout diagram generated by executing some or all of a method 600 discussed below with respect to FIG. 6, and each corresponding embodiment of level shifting circuit 100 is a non-limiting example of an IC structure manufactured based on IC layout diagram 100A or 100B by executing some or all of a method 700 discussed below with respect to FIG. 7.

Figure 4B:
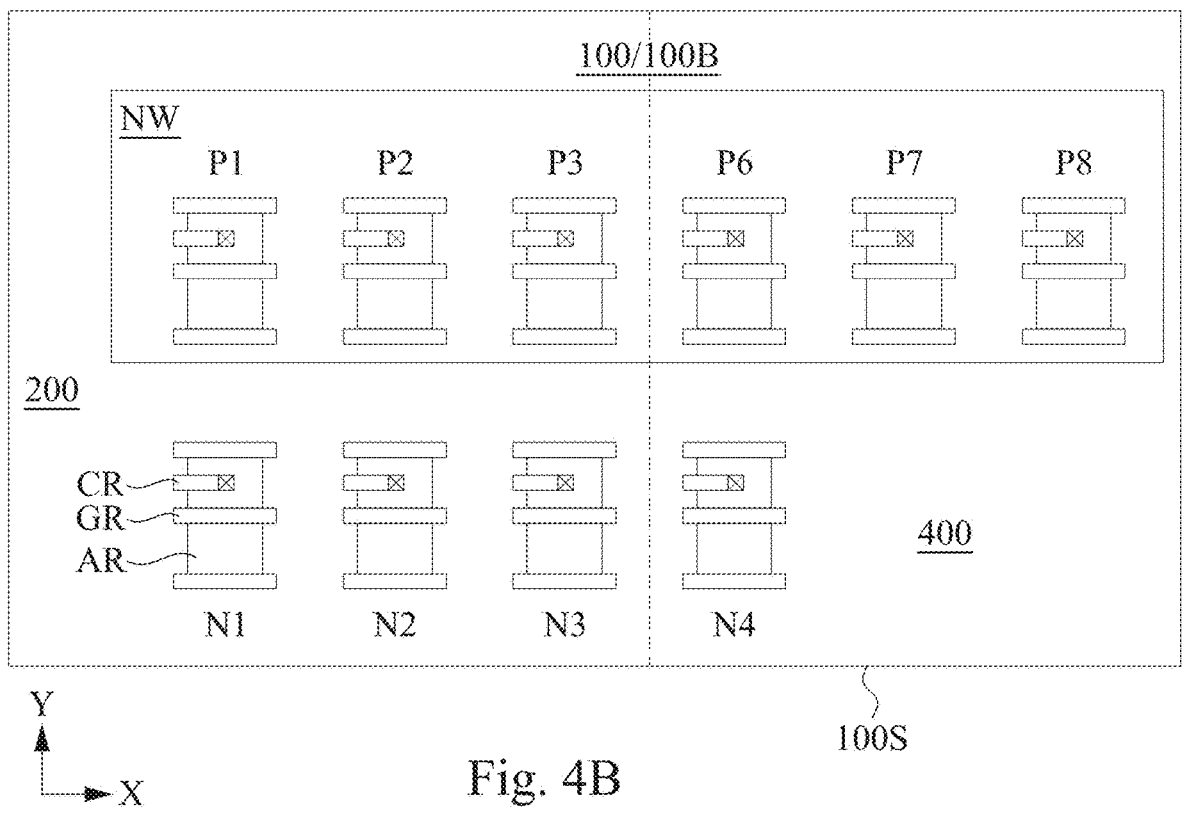
FIG. 4B is a diagram of an IC layout diagram and a level shifting circuit, in accordance with some embodiments.

The diagrams of FIGS. 3B and 4B are simplified for the purpose of illustration. FIGS. 3B and 4B depict views of IC layout diagram 100A or 100B and level shifting circuit 100 with various features included and excluded to facilitate the discussion below. In various embodiments, one or more of IC layout diagrams 100A or 100B or level shifting circuit 100 includes one or more elements corresponding to metal interconnects, contacts, vias, gate structures, S/D structures, or other transistor elements, wells, isolation structures, or the like, in addition to the elements depicted in FIGS. 3B and 4B.

Bias circuit 300 includes power supply nodes NVDD1 and NVDD2 and output terminal 112, and is thereby configured to receive power supply voltage VDD1 on power supply node NVDD1 and power supply voltage VDD2 on power supply node NVDD2, each discussed above with respect to FIGS. 1A and 1B.

Bias circuit 300 also includes PMOS transistors P4 and P5. PMOS transistor P4 is coupled between power supply node NVDD1 and output terminal 112, a gate of transistor P4 is coupled to power supply node NVDD2, and a bulk terminal of transistor P4 is coupled to output terminal 112. PMOS transistor P5 is coupled between power supply node NVDD2 and output terminal 112, a gate of transistor P5 is coupled to power supply node NVDD1, and a bulk terminal of transistor P5 is coupled to output terminal 112.

PMOS transistors P4 and P5 are thereby arranged as cross-coupled PMOS transistors in which each of a first S/D terminal of PMOS transistor P4 and the gate of PMOS transistor P5 is configured to receive power supply voltage VDD1, and each of a first S/D terminal of PMOS transistor P5 and the gate of PMOS transistor P4 is configured to receive power supply voltage VDD2.

Second S/D terminals of PMOS transistors P4 and P5 are coupled to each other and to output terminal 112. In some embodiments, the second S/D terminals of PMOS transistors P4 and P5 are a same S/D terminal shared by PMOS transistors P4 and P5. In some embodiments, output terminal 112 corresponds to n-well NW in which PMOS transistors P4 and P5 are positioned.

In some embodiments, when each of the first and second power domains is operating in the power-on mode, the first power supply voltage level of power supply voltage VDD1 is greater than the second power supply voltage level of power supply voltage VDD2 by a magnitude greater than a threshold voltage of PMOS transistor P4. When the first power domain is operating in the power-on mode and the second power domain is operating in the power down mode, the first power supply voltage level of power supply voltage VDD1 is greater than the reference voltage level of power supply voltage VDD2 by a magnitude greater than the threshold voltage of PMOS transistor P4. In such embodiments, when the first power domain is operating in the power-on mode, bias circuit 300 is thereby configured such that PMOS transistor P4 is switched on and PMOS transistor P5 is switched off independent of the power-on or power-down mode of the second power domain.

In some embodiments, when each of the first and second power domains is operating in the power-on mode, the second power supply voltage level of power supply voltage VDD2 is greater than the first power supply voltage level of power supply voltage VDD1 by a magnitude greater than a threshold voltage of PMOS transistor P5. When the second power domain is operating in the power-on mode and the first power domain is operating in the power-down mode, the second power supply voltage level of power supply voltage VDD2 is greater than the reference voltage level of power supply voltage VDD1 by a magnitude greater than the threshold voltage of PMOS transistor P5. In such embodiments, when the second power domain is operating in the power-on mode, bias circuit 300 is thereby configured such that PMOS transistor P5 is switched on and PMOS transistor P4 is switched off independent of the power-on or power-down mode of the first power domain.

Because a S/D terminal of PMOS transistor P4 is coupled to output terminal 112, the combination of PMOS transistor P4 being switched on and PMOS transistor P5 being switched off couples output terminal 112 to power supply node NVDD1, thereby generating bias voltage VNW on output terminal 112 having the first power supply voltage level of power supply voltage VDD1. Because a S/D terminal of PMOS transistor P5 is coupled to output terminal 112, the combination of PMOS transistor P5 being switched on and PMOS transistor P4 being switched off couples output terminal 112 to power supply node NVDD2, thereby generating bias voltage VNW on output terminal 112 having the second power supply voltage level of power supply voltage VDD2.

In each of the embodiments discussed above, bias circuit 300 is thereby configured such that when the first power domain is operating in the power-down, mode, bias circuit 300 generates bias voltage VNW on output terminal 112 having the voltage level of power supply voltage VDD2, and when the second power domain is operating in the power-down mode, bias circuit 300 generates bias voltage VNW on output terminal 112 having the voltage level of power supply voltage VDD1. When each of the first and second power domains is operating in the power-down mode, bias circuit 300 is thereby configured to generate bias voltage VNW on output terminal 112 having the reference voltage level of each of power supply voltages VDD1 and VDD2.

In the embodiment depicted in FIG. 3B, each of PMOS transistors P1-P3 of level shifter 200 and PMOS transistors P4 and P5 of bias circuit 300 is positioned in n-well NW, and each of NMOS transistors N1-N3 of level shifter 200 is positioned in substrate region 100S outside of n-well NW.

An n-well, e.g., n-well NW, refers to both a region in an IC layout diagram, e.g., IC layout diagram 100A, and the portion of the semiconductor wafer positioned within the substrate region, discussed above with respect to FIG. 1B, at least partially defined by the IC layout region being included in a manufacturing process.

A transistor, e.g., a PMOS transistor P1-P5 or NMOS transistor N1-N3, refers to both a plurality of regions in the IC layout diagram and an IC device at least partially defined by the plurality of IC layout regions being included in the manufacturing process. In the embodiment depicted in FIG. 3B, a transistor includes an active region AR, one or more gate regions GR, and one or more conductive regions CR, a representative subset labeled with respect to NMOS transistor N1.

An active region, e.g., active region AR, refers to both a region in the IC layout diagram and a resultant structure at least partially defined by the region being included in the manufacturing process. The structure is a continuous volume of one or more layers of one or more semiconductor materials having either n-type or p-type doping. In various embodiments, an active region structure includes one or more of Si, silicon-germanium (SiGe), silicon-carbide (SiC), B, P, As, Al, gallium (Ga), or another suitable material. In some embodiments, an active region structure includes a single monolayer or multiple monolayers of a given material.

In various embodiments, an active region structure includes one or more portions included in one or more of a planar transistor, a fin field-effect transistor (FinFET), or a gate all around (GAA) transistor and/or includes one or more S/D structures (not shown). In some embodiments, an active region structure is electrically isolated from other elements in the semiconductor substrate region by one or more isolation structures (not shown), e.g., one or more shallow trench isolation (STI) structures.

A gate region, e.g., gate region GR, refers to both a region in the IC layout diagram and a resultant structure at least partially defined by the region being included in the manufacturing process. A gate region structure is a volume overlying the semiconductor substrate and active region and includes one or more conductive materials substantially surrounded by one or more dielectric layers (not shown) including one or more dielectric materials configured to electrically isolate the one or more conductive materials from overlying, underlying, and/or adjacent structures, e.g., active region AR.

Conductive materials include one or more of polysilicon, Al, copper (Cu), tungsten (W), cobalt (Co), ruthenium (Ru), or one or more other metals, and/or one or more other suitable materials. Dielectric materials include one or more of silicon dioxide (SiO2), silicon nitride (Si3N4), and/or a high-k dielectric material, e.g., a dielectric material having a k value higher than 3.8 or 7.0 such as aluminum oxide (Al2O3), hafnium oxide (HfO2), tantalum pentoxide (Ta2O5), or titanium oxide (TiO2), or another suitable material.

In some cases, a location at which a gate region intersects an active region in the IC layout diagram corresponds to a transistor in the IC structure that includes some or all of portions of the corresponding gate structure, some or all of the corresponding active region partially surrounded by, and/or adjacent to the corresponding gate structure, and S/D structures in and/or on the corresponding active region and adjacent to the corresponding gate structure. In other cases, a gate region intersects an active region at a location that does not correspond to a transistor, and the corresponding gate structure or portion thereof is referred to as a dummy gate structure in some embodiments.

A conductive region, e.g., conductive region CR, refers to both a region in the IC layout diagram and a resultant structure at least partially defined by the region being included in the manufacturing process. A conductive region structure, also referred to as a conductive segment, conductive line, or via in some embodiments, is one or more portions of one or more corresponding layers that include one or more conductive materials suitable for providing a low resistance electrical connection between IC structure elements, i.e., a resistance level below a predetermined threshold corresponding to one or more tolerance levels of a resistance-based effect on circuit performance. In some embodiments, a conductive region refers to a plurality of conductive regions in the IC layout diagram and a corresponding plurality of resultant structures, e.g., a conductive segment and a via.

In some embodiments, one or more conductive regions correspond to a node, e.g., one or more of reference node NVSS or power supply nodes NVDD1 or NVDD2 discussed above with respect to FIGS. 1A-2 or power supply nodes NVDDA or NVDDB discussed below with respect to FIGS. 4A and 4B. In some embodiments, one or more conductive regions correspond to one or more portions of a power distribution structure, e.g., a power distribution structure of a power domain as discussed above with respect to FIGS. 1A and 1B.

In the embodiment depicted in FIG. 3B, IC layout diagram 100A includes n-well NW, active regions AR, gate regions GR, and conductive regions CR thereby arranged so as to at least partially define PMOS transistors P1-P3 and NMOS transistors N1-N3 configured in accordance with level shifter 200, and PMOS transistors P4 and P5 configured in accordance with bias circuit 300 corresponding to the embodiment of level shifting circuit 100 discussed above. In some embodiments, layout diagram 100A includes n-well NW, active regions AR, gate regions GR, and conductive regions CR otherwise arranged, e.g., by including a plurality of n-wells NW arranged as a common n-well discussed above with respect to FIG. 1B, such that PMOS transistors P1-P3 and NMOS transistors N1-N3 are configured in accordance with level shifter 200, and PMOS transistors P4 and P5 are configured in accordance with bias circuit 300 corresponding to the embodiment of level shifting circuit 100 discussed above.

By the configuration discussed above, bias circuit 300 is capable of generating bias voltage VNW having the voltage levels discussed above with respect to bias circuit 110 such that circuit 100 including bias circuit 300 is capable of realizing the benefits discussed above with respect to FIGS. 1A and 1B.

Bias circuit 400 includes reference node NVSS and output terminal 112, and is thereby configured to receive reference voltage VSS on reference node NVSS, each discussed above with respect to FIGS. 1A and 1B. Bias circuit 400 also includes a power supply node NVDDA configured to have a power supply voltage VDDA and a power supply node NVDDB configured to have a power supply voltage VDDB.

In some embodiments, power supply nodes NVDDA and NVDDB correspond to respective power supply nodes NVDD1 and NVDD2 discussed above with respect to FIGS. 1A and 1B such that bias circuit 400 is thereby configured to receive power supply voltage VDDA corresponding to power supply voltage VDD1 on power supply node NVDDA, and power supply voltage VDDB corresponding to power supply voltage VDD2 on power supply node NVDDB. In some embodiments, power supply nodes NVDDA and NVDDB correspond to respective power supply nodes NVDD2 and NVDD1 such that bias circuit 400 is thereby configured to receive power supply voltage VDDA corresponding to power supply voltage VDD2 on power supply node NVDDA and power supply voltage VDDB corresponding to power supply voltage VDD1 on power supply node NVDDB.

When each of the first and second power domains is operating in the power-on mode, power supply voltage VDDB has a voltage level greater than that of power supply voltage VDDA.

Bias circuit 400 also includes PMOS transistors P6-P8, NMOS transistor N4, and a node ND2. PMOS transistor P6, node ND2, and NMOS transistor N4 are coupled in series between power supply node NVDDA and reference node NVSS, and gates of PMOS transistor P6 and NMOS transistor N4 are coupled to each other and to power supply node NVDDB; PMOS transistor P6, node ND2, and NMOS transistor N4 are thereby arranged as an inverter configured to receive power supply voltage VDDB. A bulk terminal of PMOS transistor P6 is coupled to output terminal 112 and a bulk terminal of NMOS transistor N4 is coupled to reference node NVSS.

PMOS transistor P7 is coupled between power supply node NVDDB and output terminal 112, a gate of transistor P7 is coupled to node ND2, and a bulk terminal of transistor P7 is coupled to output terminal 112. PMOS transistor P8 is coupled between power supply node NVDDA and output terminal 112, a gate of transistor P8 is coupled to power supply node NVDDB, and a bulk terminal of transistor P8 is coupled to output terminal 112.

S/D terminals of PMOS transistors P7 and P8 are coupled to each other and to output terminal 112. In some embodiments, the S/D terminals of PMOS transistors P7 and P8 are a same S/D terminal shared by PMOS transistors P7 and P8. In some embodiments, output terminal 112 corresponds to n-well NW in which PMOS transistors P7 and P8 are positioned.

When the power domain corresponding to power supply voltage VDDB (power supply voltage VDDB domain) is operating in the power-on mode, the voltage level of power supply voltage VDDB is greater than the reference voltage level of reference voltage VSS by a magnitude greater than a threshold voltage of NMOS transistor N4, thereby causing NMOS transistor N4 to be switched on independent of the power-on or power-down mode of the power domain corresponding to power supply voltage VDDA (power supply voltage VDDA domain). Because power supply voltage VDDB has the voltage level greater than that of power supply voltage VDDA independent of the power-on or power-down mode of the power supply voltage VDDA domain, the power supply voltage VDDB domain operating in the power-on mode thereby causes each of PMOS transistors P6 and P8 to be switched off independent of the power-on or power-down mode of the power supply voltage VDDA domain.

NMOS transistor N4 being switched on and PMOS transistor P6 being switched off couples node ND2 to reference node NVSS and decouples node ND2 from power supply node NVDDA such that voltage VND2 on node ND2 has the reference voltage level. The voltage level of power supply voltage VDDB being greater than the reference voltage level by a magnitude greater than a threshold voltage of PMOS transistor P7 causes PMOS transistor P7 to be switched on. When the power supply voltage VDDB domain is operating in the power-on mode, PMOS transistor P7 is thereby switched on and PMOS transistor P8 is thereby switched off independent of the power-on or power-down mode of the power supply voltage VDDA domain.

Because an S/D terminal of PMOS transistor P7 is coupled to output terminal 112, the combination of PMOS transistor P7 being switched on and PMOS transistor P8 being switched off couples output terminal 112 to power supply node NVDDB, and bias circuit 400 is thereby configured to generate bias voltage VNW on output terminal 112 having the voltage level of power supply voltage VDDB independent of the power-on or power-down mode of the power supply voltage VDDA domain.

When the power supply voltage VDDA domain is operating in the power-on mode and the power supply voltage VDDB domain is operating in the power-down mode, power supply voltage VDDB having the reference voltage level causes NMOS transistor N4 to be switched off. The voltage level of power supply voltage VDDA being greater than the reference voltage level of power supply voltage VDDB by a magnitude greater than a threshold voltage of PMOS transistors P6 and P8 causes each of PMOS transistors P6 and P8 to be switched on.

NMOS transistor N4 being switched off and PMOS transistor P6 being switched on couples node ND2 to power supply node NVDDA and decouples node ND2 from reference node NVSS such that voltage VND2 on node ND2 has the voltage level of power supply voltage VDDA. The voltage level of power supply voltage VDDA being greater than the reference voltage level of power supply voltage VDDB causes PMOS transistor P7 to be switched off. When the power supply voltage VDDA domain is operating in the power-on mode and the power supply voltage VDDB domain is operating in the power-down mode, PMOS transistor P8 is thereby switched on and PMOS transistor P7 is thereby switched off.

Because a S/D terminal of PMOS transistor P8 is coupled to output terminal 112, the combination of PMOS transistor P8 being switched on and PMOS transistor P7 being switched off couples output terminal 112 to power supply node NVDDA, and bias circuit 400 is thereby configured to generate bias voltage VNW on output terminal 112 having the voltage level of power supply voltage VDDA when the power supply voltage VDDA domain is operating in the power-on mode and the power supply voltage VDDB domain is operating in the power-down mode.

When each of the power supply voltage VDDA domain and power supply voltage VDDB domain is operating in the power-down mode, bias circuit 400 is thereby configured to generate bias voltage VNW on output terminal 112 having the reference voltage level.

In the embodiment depicted in FIG. 4B, each of PMOS transistors P1-P3 of level shifter 200 and PMOS transistors P6-P8 of bias circuit 400 is positioned in n-well NW, and each of NMOS transistors N1-N3 of level shifter 200 and NMOS transistor N4 of bias circuit 400 is positioned in substrate region 100S outside of n-well NW.

In the embodiment depicted in FIG. 4B, IC layout diagram 100B includes n-well NW, active regions AR, gate regions GR, and conductive regions CR thereby arranged so as to at least partially define PMOS transistors P1-P3 and NMOS transistors N1-N3 configured in accordance with level shifter 200, and PMOS transistors P6-P8 and NMOS transistor N4 configured in accordance with bias circuit 400 corresponding to the embodiment of level shifting circuit 100 discussed above. In some embodiments, layout diagram 100B includes n-well NW, active regions AR, gate regions GR, and conductive regions CR otherwise arranged, e.g., by including a plurality of n-wells NW arranged as a common n-well discussed above with respect to FIG. 1B, such that PMOS transistors P1-P3 and NMOS transistors N1-N3 are configured in accordance with level shifter 200, and PMOS transistors P6-P8 and NMOS transistor N4 are configured in accordance with bias circuit 400 corresponding to the embodiment of level shifting circuit 100 discussed above.

By the configuration discussed above, bias circuit 400 is capable of generating bias voltage VNW having the voltage levels discussed above with respect to bias circuit 110 such that circuit 100 including bias circuit 400 is capable of realizing the benefits discussed above with respect to FIGS. 1A and 1B.

Compared to bias circuit 300, bias circuit 400 includes additional features and is thereby further capable of generating bias voltage VNW having the voltage levels discussed above with respect to bias circuit 110 in embodiments in which power supply voltage VDDB, corresponding to one of power supply voltages VDD1 or VDD2, has a voltage level greater than that of power supply voltage VDDA, corresponding to the other of power supply voltages VDD1 or VDD2, by a magnitude that is less than a threshold voltage of a corresponding PMOS transistor, e.g., PMOS transistor P4 or P5.

FIG. 5 is a flowchart of a method 500 of operating a level shifting circuit, in accordance with one or more embodiments. Method 500 is usable with a level shifting circuit, e.g., circuit 100 discussed above with respect to FIGS. 1A and 1B.

The sequence in which the operations of method 500 are depicted in FIG. 5 is for illustration only; the operations of method 500 are capable of being executed in sequences that differ from that depicted in FIG. 5. In some embodiments, operations in addition to those depicted in FIG. 5 are performed before, between, during, and/or after the operations depicted in FIG. 5.

In some embodiments, some or all of the operations of method 500 are a subset of a method of operating a circuit including a level shifting circuit, e.g., an input-output circuit or a power or sleep mode control circuit.

At operation 510, first and second power supply voltages are received at a bias circuit. Receiving the first power supply voltage includes receiving the first power supply voltage having a first voltage level equal to a first power supply voltage level of a first power domain or to a reference voltage level. In some embodiments, receiving the first power supply voltage having the first voltage level equal to the first power supply voltage level includes operating the first power domain in a power-on mode, and receiving the first power supply voltage having the first voltage level equal to the reference voltage level includes operating the first power domain in a power-down mode.

Receiving the second power supply voltage includes receiving the second power supply voltage having a second voltage level equal to a second power supply voltage level of a second power domain or to the reference voltage level. In some embodiments, receiving the second power supply voltage having the second voltage level equal to the second power supply voltage level includes operating the second power domain in the power-on mode, and receiving the second power supply voltage having the second voltage level equal to the reference voltage level includes operating the second power domain in the power-down mode.

Receiving the first and second power supply voltages having the first voltage level equal to the first power supply voltage level and/or the second voltage level equal to the second power supply voltage level includes the first power supply voltage level being different from the second power supply voltage level.

In some embodiments, receiving the first and second power supply voltages at the bias circuit includes receiving power supply voltages VDD1 and VDD2 at one of bias circuit 110 discussed above with respect to FIGS. 1A and 1B or bias circuit 300 discussed above with respect to FIGS. 3A and 3B. In some embodiments, receiving the first and second power supply voltages at the bias circuit includes receiving power supply voltages VDDA and VDDB at bias circuit 400 discussed above with respect to FIGS. 4A and 4B.

In some embodiments, receiving the first and second power supply voltages at the bias circuit includes receiving the first and second power supply voltages at S/D terminals of PMOS transistors of the bias circuit. In some embodiments, receiving the first and second power supply voltages at the bias circuit includes receiving power supply voltages VDD1 and VDD2 at S/D terminals of PMOS transistors P4 and P5 of bias circuit 300 discussed above with respect to FIGS. 3A and 3B, or power supply voltages VDDA1 and VDDB at S/D terminals of PMOS transistors P6-P8 of bias circuit 400 discussed above with respect to FIGS. 4A and 4B.

At operation 520, the bias circuit is used to generate a bias voltage based on the greater of the first voltage level of the first power supply voltage or the second voltage level of the second power supply voltage. In various embodiments, generating the bias voltage includes generating the bias voltage having a bias voltage level equal to the greater of the first or second voltage levels, or having a bias voltage level equal to a fraction of the greater of the first or second voltage levels.

In some embodiments, generating the bias voltage includes operating each of the first and second power domains in the power-on mode, and generating the bias voltage having the first voltage level based on the first voltage level being greater than the second voltage level, or generating the bias voltage having the second voltage level based on the second voltage level being greater than the first voltage level.

In some embodiments, generating the bias voltage includes operating the first power domain in the power-on mode and operating the second power domain in the power-down mode, and generating the bias voltage having the first voltage level based on the first voltage level being greater than the reference voltage level.

In some embodiments, generating the bias voltage includes operating the first power domain in the power-down mode and operating the second power domain in the power-on mode, and generating the bias voltage having the second voltage level based on the second voltage level being greater than the reference voltage level.

In some embodiments, generating the bias voltage includes operating each of the first and second power domains in the power-down mode, and generating the bias voltage having the reference voltage level based on each of the first and second power supply voltages having the reference voltage level.

In some embodiments, generating the bias voltage using the bias circuit includes generating bias voltage VNW using one of bias circuit 110 discussed above with respect to FIGS. 1A and 1B, bias circuit 300 discussed above with respect to FIGS. 3A and 3B, or bias circuit 400 discussed above with respect to FIGS. 4A and 4B.

In some embodiments, generating the bias voltage using the bias circuit includes using two PMOS transistors of the bias circuit, the two PMOS transistors being positioned in a common n-well and including S/D terminals coupled to each other. In some embodiments, using the PMOS transistors positioned in the common n-well and including S/D terminals coupled to each other includes using a S/D terminal shared by the two PMOS transistors. In some embodiments, using the two PMOS transistors positioned in the common n-well includes using the two PMOS transistors positioned in n-well NW or plurality of n-wells NW, discussed above with respect to FIGS. 1A-4B.

In some embodiments, generating the bias voltage using the two PMOS transistors including S/D terminals coupled to each other includes generating the bias voltage having the first voltage level by switching on one of the two PMOS transistors, and generating the bias voltage having the second voltage level by switching on the other of the two PMOS transistors.

In some embodiments, generating the bias voltage using the two PMOS transistors including S/D terminals coupled to each other includes using PMOS transistors P4 and P5 of bias circuit 300 discussed above with respect to FIGS. 3A and 3B, or PMOS transistors P7 and P8 of bias circuit 400 discussed above with respect to FIGS. 4A and 4B.

At operation 530, the first power supply voltage is received at a first S/D terminal of a first PMOS transistor of a level shifter. Receiving the first power supply voltage at the first S/D terminal of the first PMOS transistor of the level shifter includes the first PMOS transistor being positioned in the common n-well, e.g., n-well NW or plurality of n-wells NW, discussed above with respect to FIGS. 1A-4B.

In some embodiments, receiving the first power supply voltage at the first S/D terminal of the first PMOS transistor of the level shifter includes receiving power supply voltage VDD1 at level shifter 120, discussed above with respect to FIGS. 1A and 1B. In some embodiments, receiving the first power supply voltage at the first S/D terminal of the first PMOS transistor of the level shifter includes receiving power supply voltage VDD1 at the S/D terminal of PMOS transistor P1 of level shifter 200, discussed above with respect to FIG. 2.

In some embodiments, receiving the first power supply voltage at the first S/D terminal of the first PMOS transistor includes receiving the first power supply voltage at an inverter including the first PMOS transistor. In some embodiments, receiving the first power supply voltage at the inverter includes receiving power supply voltage VDD1 at the S/D terminal of PMOS transistor P1 coupled in series with NMOS transistor N1, as discussed above with respect to FIG. 2.

At operation 540, the second power supply voltage is received at a second S/D terminal of a second PMOS transistor of the level shifter. Receiving the second power supply voltage at the second S/D terminal of the second PMOS transistor of the level shifter includes the second PMOS transistor being positioned in the common n-well, e.g., n-well NW or plurality of n-wells NW, discussed above with respect to FIGS. 1A-4B.

In some embodiments, receiving the second power supply voltage at the second S/D terminal of the second PMOS transistor of the level shifter includes receiving power supply voltage VDD2 at level shifter 120, discussed above with respect to FIGS. 1A and 1B. In some embodiments, receiving the second power supply voltage at the second S/D terminal of the second PMOS transistor of the level shifter includes receiving power supply voltage VDD2 at the S/D terminal of PMOS transistor P2 or P3 of level shifter 200, discussed above with respect to FIG. 2.

In some embodiments, receiving the second power supply voltage at the second S/D terminal of the second PMOS transistor includes receiving the second power supply voltage at a cross-coupled transistor pair including the second PMOS transistor. In some embodiments, receiving the second power supply voltage at the cross-coupled transistor pair includes receiving power supply voltage VDD2 at the S/D terminal of one of cross-coupled PMOS transistors P2 or P3, as discussed above with respect to FIG. 2.

At operation 550, the bias voltage is used to bias the common n-well containing the first and second PMOS transistors. In some embodiments, using the bias voltage to bias the common n-well includes using bias voltage VNW to bias n-well NW as discussed above with respect to FIGS. 1A-4B.

In some embodiments, using the bias voltage to bias the common n-well includes operating each of the first and second power domains in the power-on mode, and using the bias voltage having the first voltage level based on the first voltage level being greater than the second voltage level, or using the bias voltage having the second voltage level based on the second voltage level being greater than the first voltage level.

In some embodiments, operating each of the first and second power domains in the power-on mode includes receiving an input signal at an input terminal of the level shifter and, in response to the input signal, generating an output signal at an output terminal of the level shifter. In some embodiments, receiving the input signal includes receiving input signal IN discussed above with respect to FIGS. 1A-2. In some embodiments, generating the output signal includes generating output signal OUT discussed above with respect to FIGS. 1A-2 or generating complementary components OUTA and OUTB discussed above with respect to FIG. 2.

In some embodiments, using the bias voltage to bias the common n-well includes operating the first power domain in the power-on mode and operating the second power domain in the power-down mode, and using the bias voltage having the first voltage level based on the first voltage level being greater than the reference voltage level.

In some embodiments, using the bias voltage to bias the common n-well includes operating the first power domain in the power-down mode and operating the second power domain in the power-on mode, and using the bias voltage having the second voltage level based on the second voltage level being greater than the reference voltage level.

In some embodiments, using the bias voltage to bias the common n-well includes operating each of the first and second power domains in the power-down mode, and using the bias voltage having the reference voltage level based on each of the first and second power supply voltages having the reference voltage level In some embodiments, using the bias voltage to bias the common n-well includes reverse-biasing diode junctions of the first and second PMOS transistors. In some embodiments, reverse-biasing diode junctions of the first and second PMOS transistors includes reverse-biasing diode junctions of PMOS transistors P1-P3 of level shifter 200 discussed above with respect to FIG. 2.

By executing some or all of the operations of method 500, a bias voltage is generated by a bias circuit and used to bias a common n-well in which PMOS transistors of a level shifter operate, thereby obtaining the benefits discussed above with respect to level shifting circuit 100.

FIG. 6 is a flowchart of a method 600 of generating an IC layout diagram, in accordance with some embodiments. In some embodiments, generating the IC layout diagram includes generating an IC layout diagram, e.g., an IC layout diagram 100A or 100B corresponding to a level shifting circuit 100 manufactured based on the generated IC layout diagram, as discussed above with respect to FIGS. 1A-4B.

In some embodiments, some or all of method 600 is executed by a processor of a computer. In some embodiments, some or all of method 600 is executed by a processor 802 of an IC layout diagram generation system 800, discussed below with respect to FIG. 8.

Some or all of the operations of method 600 are capable of being performed as part of a design procedure performed in a design house, e.g., a design house 920 discussed below with respect to FIG. 9.

In some embodiments, the operations of method 600 are performed in the order depicted in FIG. 6. In some embodiments, the operations of method 600 are performed simultaneously and/or in an order other than the order depicted in FIG. 6. In some embodiments, one or more operations are performed before, between, during, and/or after performing one or more operations of method 600.

At operation 610, in some embodiments, first through fourth PMOS transistors are defined in an n-well region. Defining the first through fourth PMOS transistors includes at least partially defining each of the first through fourth PMOS transistors by arranging a plurality of IC layout diagram regions in the IC layout diagram. In some embodiments, arranging the plurality of IC layout diagram regions includes arranging active regions AR in n-well NW and intersecting active regions AR with gate regions GR, each discussed above with respect to FIGS. 3B and 4B.

In some embodiments, defining the first through fourth PMOS transistors in the n-well region includes defining the first through fourth PMOS transistors in n-well region NW discussed above with respect to FIGS. 1A-5. In some embodiments, defining the first through fourth PMOS transistors in n-well NW includes defining the first through fourth PMOS transistors in a common n-well including plurality of n-wells NW.

In some embodiments, defining the first and second of the first through fourth PMOS transistors includes defining PMOS transistors P4 and P5 discussed above with respect to bias circuit 300 and FIGS. 3A and 3B. In some embodiments, defining the first and second of the first through fourth PMOS transistors includes defining PMOS transistors P6-P8 discussed above with respect to bias circuit 400 and FIGS. 4A and 4B.

In some embodiments, defining the third and fourth of the first through fourth PMOS transistors includes defining PMOS transistors P1-P3 discussed above with respect to FIGS. 2-4B.

In some embodiments, defining the first through fourth PMOS transistors in the n-well region includes defining one or more NMOS transistors outside the n-well region, e.g., NMOS transistors N1-N3 discussed above with respect to FIGS. 2-4B and/or NMOS transistor N4 discussed above with respect to FIGS. 4A and 4B.

At operation 620, a plurality of conductive regions is arranged whereby a bias circuit is configured to include the first and second PMOS transistors and a level shifter is configured to include the third and fourth PMOS transistors. In some embodiments, configuring the bias circuit to include the first and second PMOS transistors includes configuring bias circuit 110 discussed above with respect to FIGS. 1A and 1B. In some embodiments, configuring the bias circuit to include the first and second PMOS transistors includes configuring bias circuit 300 to include PMOS transistors P4 and P5 discussed above with respect to FIGS. 3A and 3B. In some embodiments, configuring the bias circuit to include the first and second PMOS transistors includes configuring bias circuit 400 to include PMOS transistors P6-P8 discussed above with respect to FIGS. 4A and 4B.

In some embodiments, configuring the level shifter to include the third and fourth PMOS transistors includes configuring level shifter 120 discussed above with respect to FIGS. 1A and 1B. In some embodiments, configuring the level shifter to include the third and fourth PMOS transistors includes configuring level shifter 200 to include PMOS transistors P1-P3 discussed above with respect to FIGS. 2-4B.

Arranging the plurality of conductive regions includes at least partially defining conductive structures by arranging the plurality of conductive regions in the IC layout diagram. In some embodiments, arranging the plurality of conductive regions includes arranging conductive regions CR discussed above with respect to FIGS. 3B and 4B.

At operation 630, a plurality of conductive elements is arranged whereby a first power domain includes electrical connections to each of the first and third PMOS transistors and a second power domain includes electrical connections to each of the second and fourth PMOS transistors. Arranging the plurality of conductive elements includes arranging conductive regions corresponding to each of the first and second power domains, thereby at least partially defining electrical connections to S/D structures of each of the first through fourth PMOS transistors.

In some embodiments, arranging the plurality of conductive elements includes configuring a power distribution structure of the first power domain to include power supply node NVDD1 and a power distribution structure of the second power domain to include power supply node NVDD2, each discussed above with respect to FIGS. 1A-4B. In some embodiments, arranging the plurality of conductive elements includes configuring power distribution structures of the first and second power domains to include power supply nodes NVDDA and NVDDB discussed above with respect to FIGS. 4A and 4B.

In some embodiments, arranging the plurality of conductive elements includes configuring one or more power distribution structures to include reference node NVSS discussed above with respect to FIGS. 1A-4B.

At operation 640, in some embodiments, the IC layout diagram including the n-well is generated. In some embodiments, generating the IC layout diagram includes generating IC layout diagram 100A or 100B discussed above with respect to FIGS. 3B and 4B.

At operation 650, in some embodiments, the IC layout diagram is stored in a storage device. Generating the IC layout diagram is performed by a processor, e.g., processor 802 of IC layout diagram generation system 800 discussed below with respect to FIG. 8.

In various embodiments, storing the IC layout diagram in the storage device includes storing the IC layout diagram in a non-volatile, computer-readable memory or a layout library, e.g., a database, and/or includes storing the IC layout diagram over a network. In various embodiments, storing the IC layout diagram in the storage device includes storing the IC layout diagram in layout library 807 and/or over network 814 of IC layout diagram generation system 800, discussed below with respect to FIG. 8.

In some embodiments, storing the IC layout diagram includes storing IC layout diagram 100A or 100B discussed above with respect to FIGS. 3B and 4B.

At operation 660, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to IC manufacturing system 900 and FIG. 9.

In some embodiments, fabricating one or more semiconductor masks or at least one component in the layer of the semiconductor IC is based on IC layout diagram 100A or 100B discussed above with respect to FIGS. 3B and 4B.

At operation 670, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 9.

In some embodiments, performing one or more manufacturing operations is based on IC layout diagram 100A or 100B discussed above with respect to FIGS. 3B and 4B.

By executing some or all of the operations of method 600, an IC layout diagram, e.g., IC layout diagram 100A or 100B, is generated capable of at least partially defining a level shifting circuit including a bias circuit and a level shifter configured as discussed above with respect to level shifting circuit 100 and thereby having the capabilities and benefits discussed above with respect to level shifting circuit 100.

FIG. 7 is a flowchart of a method 700 of manufacturing an IC structure, in accordance with some embodiments.

Method 700 is operable to form an IC structure, e.g., level shifting circuit 100 discussed above with respect to FIGS. 1A-5. In some embodiments, one or more operations of method 700 are executed based one or both of IC layout diagrams 100A or 100B discussed above with respect to FIGS. 3B and 4B.

In some embodiments, method 700 is usable by an IC manufacturing system as part of an IC manufacturing flow, e.g., IC manufacturing system 900 discussed below with respect to FIG. 9.

The sequence in which the operations of method 700 are depicted in FIG. 7 is for illustration only; the operations of method 700 are capable of being executed simultaneously and/or in sequences that differ from that depicted in FIG. 7. In some embodiments, operations in addition to those depicted in FIG. 7 are performed before, between, during, and/or after the operations depicted in FIG. 7.

In some embodiments, one or more operations of method 700 are executed using various fabrication tools, e.g., one or more of a wafer stepper, a photoresist coater, an ion implanter, a process chamber, e.g., a CVD chamber or LPCVD furnace, a CMP system, a plasma etch system, a wafer cleaning system, or other manufacturing equipment capable of performing one or more suitable manufacturing processes as discussed below.

At operation 710, in some embodiments, an n-well is formed in a semiconductor substrate. Forming the n-well includes performing one or more suitable manufacturing processes, e.g., photolithography and/or ion implantation processes.

In some embodiments, forming the n-well includes forming a common n-well including n-well NW or plurality of n-wells NW discussed above with respect to FIGS. 1A-4B. In some embodiments, forming the n-well includes forming the n-well based on n-well NW of IC layout diagram 100A or 100B discussed above with respect to FIGS. 3B and 4B.

At operation 720, first through fourth PMOS transistors are formed in the n-well. Forming the first through fourth PMOS transistors includes performing a plurality of suitable manufacturing processes, e.g., photolithography, etch, deposition, and/or ion implantation processes.

In some embodiments, forming the first and second of the first through fourth PMOS transistors includes forming PMOS transistors P4 and P5 discussed above with respect to bias circuit 300 and FIGS. 3A and 3B. In some embodiments, forming the first and second of the first through fourth PMOS transistors includes forming PMOS transistors P6-P8 discussed above with respect to bias circuit 400 and FIGS. 4A and 4B.

In some embodiments, forming the third and fourth of the first through fourth PMOS transistors includes forming PMOS transistors P1-P3 discussed above with respect to FIGS. 2-4B.

In some embodiments, forming the first through fourth PMOS transistors in the n-well region includes forming one or more NMOS transistors outside the n-well, e.g., NMOS transistors N1-N3 discussed above with respect to FIGS. 2-4B and/or NMOS transistor N4 discussed above with respect to FIGS. 4A and 4B.

At operation 730, a bias circuit including the first and second PMOS transistors and a level shifter including the third and fourth PMOS transistors is constructed. Constructing the bias circuit and the level shifter includes configuring a plurality of conductive segments supported and electrically separated by one or more insulation layers. In some embodiments, configuring the plurality of conductive segments includes performing one or more manufacturing processes, e.g., one or more deposition, patterning, etching, planarization, and/or cleaning processes, suitable for creating conductive structures arranged in accordance with circuit configuration requirements.

In some embodiments, forming the one or more insulation layers includes depositing one or more insulation materials, e.g., dielectric materials, discussed above with respect to FIGS. 1B, 3B and 4B. In some embodiments, forming the conductive segments includes performing one or more deposition processes to deposit one or more conductive materials as discussed above with respect to FIGS. 1B, 3B, and 4B.

In some embodiments, forming the conductive segments includes forming the conductive segments based on conductive regions CR discussed above with respect to FIGS. 3B and 4B.

In some embodiments, forming the bias circuit including the first and second PMOS transistors includes forming bias circuit 110 discussed above with respect to FIGS. 1A and 1B. In some embodiments, forming the bias circuit including the first and second PMOS transistors includes forming bias circuit 300 including PMOS transistors P4 and P5 discussed above with respect to FIGS. 3A and 3B. In some embodiments, forming the bias circuit including the first and second PMOS transistors includes forming bias circuit 400 including PMOS transistors P6-P8 discussed above with respect to FIGS. 4A and 4B.

In some embodiments, forming the level shifter including the third and fourth PMOS transistors includes forming level shifter 120 discussed above with respect to FIGS. 1A and 1B. In some embodiments, forming the level shifter to include the third and fourth PMOS transistors includes forming level shifter 200 including PMOS transistors P1-P3 discussed above with respect to FIGS. 2-4B.

At operation 740, a first power distribution structure is built including electrical connections to each of the first and third PMOS transistors, and a second power distribution structure is built including electrical connections to each of the second and fourth PMOS transistors. Building the first and second power distribution structures includes configuring a plurality of conductive segments supported and electrically separated by one or more insulation layers as discussed above with respect to operation 730.

Building the first and second power distribution structures includes configuring the plurality of conductive segments such that each of the power distribution structures of the first and second power domains is electrically connected to S/D structures of the first through fourth PMOS transistors.

In some embodiments, configuring the plurality of conductive elements includes configuring a power distribution structure of the first power domain to include power supply node NVDD1 and a power distribution structure of the second power domain to include power supply node NVDD2, each discussed above with respect to FIGS. 1A-4B. In some embodiments, configuring the plurality of conductive segments includes configuring power distribution structures of the first and second power domains to include power supply nodes NVDDA and NVDDB discussed above with respect to FIGS. 4A and 4B.

In some embodiments, configuring the plurality of conductive segments includes configuring one or more power distribution structures to include reference node NVSS discussed above with respect to FIGS. 1A-4B.

The operations of method 700 are usable to form an IC structure, e.g., level shifting circuit 100, that includes a bias circuit and a level shifter configured as discussed above with respect to level shifting circuit 100 and thereby having the capabilities and benefits discussed above with respect to level shifting circuit 100.

Figure 8:
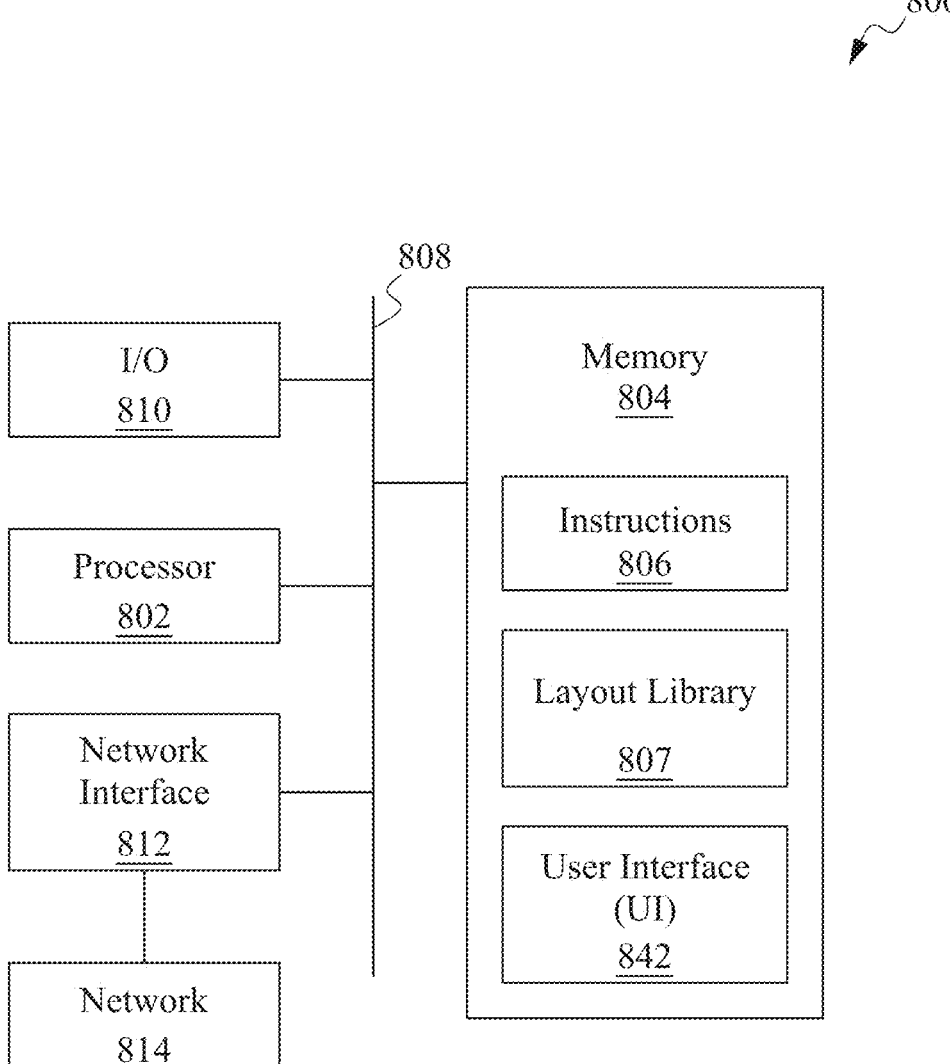
FIG. 8 is a block diagram of an IC layout diagram generation system, in accordance with some embodiments.

FIG. 8 is a block diagram of IC layout diagram generation system 800, in accordance with some embodiments. Methods described herein of designing IC layout diagrams in accordance with one or more embodiments are implementable, for example, using IC layout diagram generation system 800, in accordance with some embodiments.

In some embodiments, IC layout diagram generation system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of a method, e.g., method 600 of generating an IC layout diagram described above with respect to FIG. 6 (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause IC layout diagram generation system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause IC layout diagram generation system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores layout library 807 including such IC layout diagrams as disclosed herein, IC layout diagrams 100A and 100B discussed above with respect to FIGS. 3B and 4B.

IC layout diagram generation system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

IC layout diagram generation system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 800.

IC layout diagram generation system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. IC layout diagram generation system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
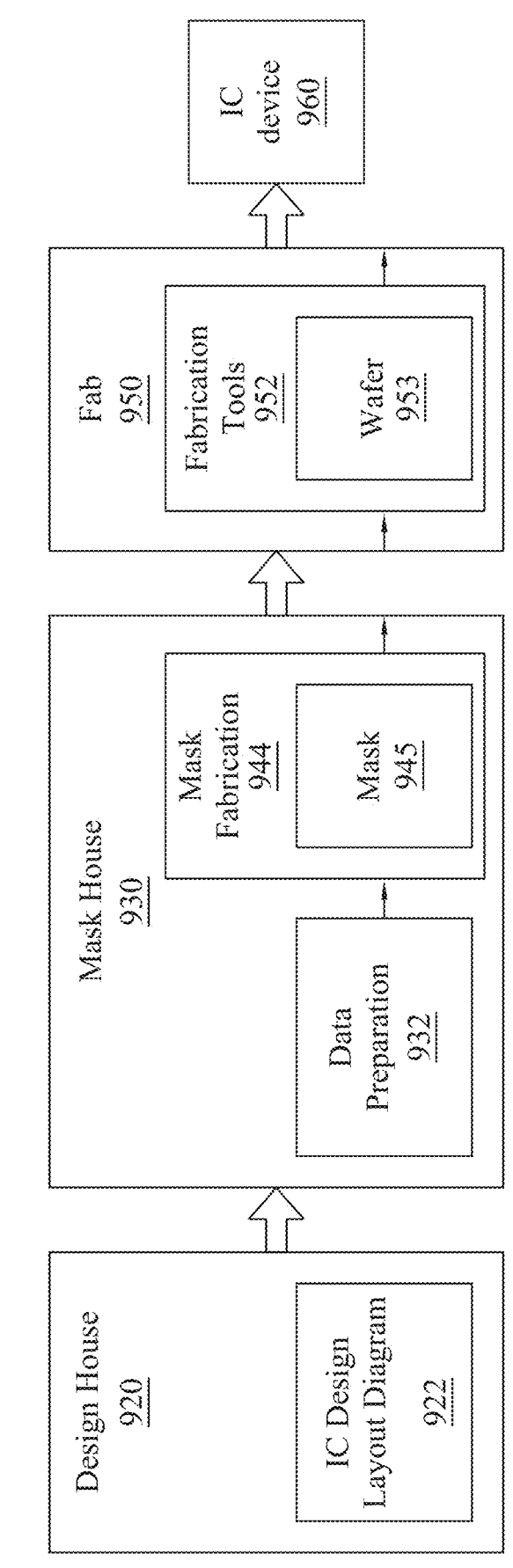
FIG. 9 is a block diagram of an IC manufacturing system, and an IC manufacturing flow associated therewith, in accordance with some embodiments.

FIG. 9 is a block diagram of IC manufacturing system 900, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns, e.g., an IC layout diagram 100A or 100B discussed above with respect to FIGS. 3B and 4B. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 945 includes a transparent substrate (e.g., a fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes wafer fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Details regarding an IC manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes defining first through fourth PMOS transistors in an n-well region, arranging a plurality of conductive regions whereby a bias circuit is configured to include the first and second PMOS transistors and a level shifter is configured to include the third and fourth PMOS transistors, and arranging a plurality of conductive elements whereby a first power domain includes electrical connections to each of the first and third PMOS transistors and a second power domain includes electrical connections to each of the second and fourth PMOS transistors. In some embodiments, configuring the bias circuit to include the first and second PMOS transistors includes defining an electrical connection between the n-well region and each of a first S/D terminal and a bulk terminal of each of the first and second PMOS transistors, and arranging the plurality of conductive elements includes arranging first power domain electrical connections to each of a second S/D terminal of the first PMOS transistor and a gate of the second PMOS transistor, and arranging second power domain electrical connections to each of a second S/D terminal of the second PMOS transistor and a gate of the first PMOS transistor. In some embodiments, the first power domain is configured to have a first power supply voltage level, the second power domain is configured to have a second power supply voltage level, and either the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor. In some embodiments, configuring the bias circuit to include the first and second PMOS transistors includes defining a first electrical connection between the n-well region and each of a first S/D terminal and a bulk terminal of each of the first and second PMOS transistors, and defining a second electrical connection between a gate of the first PMOS transistor and a first S/D terminal of each of a fifth PMOS transistor and an NMOS transistor defined in a substrate region outside the n-well region, and arranging the plurality of conductive elements includes arranging first power domain electrical connections to each of a second S/D terminal of the first PMOS transistor and a gate of each of the second PMOS transistor, the fifth PMOS transistor, and the NMOS transistor, arranging second power domain electrical connections to a second S/D terminal of each of the second PMOS transistor and the fifth PMOS transistor, and arranging a reference voltage connection to a second S/D terminal of the NMOS transistor. In some embodiments, the first power domain is configured to have a first power supply voltage level, the second power domain is configured to have a second power supply voltage level, and the first power supply voltage level is greater than the second power supply voltage level by an amount less than one or more threshold voltages of the first and second PMOS transistors. In some embodiments, each of the first power domain and the second power domain is configured to operate in each of a power-on mode and a power-down mode. In some embodiments, the method includes storing the IC diagram including each of the first through fourth PMOS transistors, the n-well region, the plurality of conductive regions, and the plurality of conductive elements in a storage device.

In some embodiments, a method of generating an IC layout diagram includes defining first through fourth PMOS transistors in an n-well region and first through third NMOS transistors in a substrate region outside the n-well region, arranging a plurality of conductive regions whereby a bias circuit is configured to include the first and second PMOS transistors and a level shifter is configured to include the third and fourth PMOS transistors and the first through third NMOS transistors, and arranging a plurality of conductive elements whereby a first power domain includes electrical connections to each of the first and third PMOS transistors and a second power domain includes electrical connections to each of the second and fourth PMOS transistors. In some embodiments, configuring the bias circuit to include the first and second PMOS transistors includes defining an electrical connection between the n-well region and each of a first S/D terminal and a bulk terminal of each of the first and second PMOS transistors, and arranging the plurality of conductive elements includes arranging first power domain electrical connections to each of a second S/D terminal of the first PMOS transistor, a gate of the second PMOS transistor, and a first S/D terminal of the third PMOS transistor, and arranging second power domain electrical connections to each of a second S/D terminal of the second PMOS transistor, a gate of the first PMOS transistor, and a first S/D terminal of the fourth PMOS transistor. In some embodiments, the first power domain is configured to have a first power supply voltage level, the second power domain is configured to have a second power supply voltage level, and either the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor. In some embodiments, configuring the bias circuit to include the first and second PMOS transistors includes defining a first electrical connection between the n-well region and each of a first S/D terminal and a bulk terminal of each of the first and second PMOS transistors, and defining a second electrical connection between a gate of the first PMOS transistor and a first S/D terminal of each of a fifth PMOS transistor and a fourth NMOS transistor defined in a substrate region outside the n-well region, and arranging the plurality of conductive elements includes arranging first power domain electrical connections to each of a second S/D terminal of the first PMOS transistor, a gate of each of the second PMOS transistor, the fifth PMOS transistor, and the NMOS transistor, and a first S/D terminal of the third PMOS transistor, arranging second power domain electrical connections to a second S/D terminal of each of the second and fifth PMOS transistors and a first S/D terminal of the fourth PMOS transistor, and arranging reference voltage connections to a first S/D terminal of each of the first through third NMOS transistors and a second S/D terminal of the fourth NMOS transistor. In some embodiments, the first power domain is configured to have a first power supply voltage level, the second power domain is configured to have a second power supply voltage level, and the first power supply voltage level is greater than the second power supply voltage level by an amount less than one or more threshold voltages of the first and second PMOS transistors. In some embodiments, each of the first power domain and the second power domain is configured to operate in each of a power-on mode and a power-down mode. In some embodiments, the method includes storing the IC diagram comprising each of the first through fourth PMOS transistors, the n-well region, the first through third NMOS transistors, the plurality of conductive regions, and the plurality of conductive elements in a storage device.

In some embodiments, a method of generating an IC layout diagram includes defining first through fifth PMOS transistors in an n-well region, arranging a plurality of conductive regions whereby a bias circuit is configured to include the first and second PMOS transistors and a level shifter is configured to include the third through fifth PMOS transistors, arranging a plurality of conductive elements whereby a first power domain includes electrical connections to each of the first and third PMOS transistors and a second power domain includes electrical connections to each of the second, fourth, and fifth PMOS transistors, and storing the IC diagram comprising each of the first through fifth PMOS transistors, the n-well region, the plurality of conductive regions, and the plurality of conductive elements in a storage device. In some embodiments, configuring the bias circuit to include the first and second PMOS transistors includes defining an electrical connection between the n-well region and each of a first S/D terminal and a bulk terminal of each of the first and second PMOS transistors, and arranging the plurality of conductive elements includes arranging first power domain electrical connections to each of a second S/D terminal of the first PMOS transistor, a gate of the second PMOS transistor, and a first S/D terminal of third PMOS transistor, and arranging second power domain electrical connections to each of a second S/D terminal of the second PMOS transistor, a gate of the first PMOS transistor, and a first S/D terminal of each of the fourth and fifth PMOS transistors. In some embodiments, the first power domain is configured to have a first power supply voltage level, the second power domain is configured to have a second power supply voltage level, and either the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor. In some embodiments, configuring the bias circuit to include the first and second PMOS transistors includes defining a first electrical connection between the n-well region and each of a first S/D terminal and a bulk terminal of each of the first and second PMOS transistors, and defining a second electrical connection between a gate of the first PMOS transistor and a first S/D terminal of each of a sixth PMOS transistor and an NMOS transistor defined in a substrate region outside the n-well region, and the arranging the plurality of conductive elements includes arranging first power domain electrical connections to each of a second S/D terminal of the first PMOS transistor, a gate of each of the second PMOS transistor, the sixth PMOS transistor, and the NMOS transistor, and a first S/D terminal of the third PMOS transistor, arranging second power domain electrical connections to a second S/D terminal of each of the second PMOS transistor and the sixth PMOS transistor, and a first S/D terminal of each of the fourth and fifth PMOS transistors, and arranging a reference voltage connection to a second S/D terminal of the NMOS transistor. In some embodiments, the first power domain is configured to have a first power supply voltage level, the second power domain is configured to have a second power supply voltage level, and a difference between the first power supply voltage level and the second power supply voltage level is less than one or more threshold voltages of the first and second PMOS transistors. In some embodiments, each of the first power domain and the second power domain is configured to operate in each of a power-on mode and a power-down mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram, the method comprising:

defining first through fourth PMOS transistors in an n-well region;

arranging a plurality of conductive regions whereby a bias circuit is configured to include the first and second PMOS transistors and a level shifter is configured to include the third and fourth PMOS transistors; and arranging a plurality of conductive elements whereby a first power domain includes electrical connections to each of the first and third PMOS transistors and a second power domain includes electrical connections to each of the second and fourth PMOS transistors.

2. The method of claim 1, wherein the configuring the bias circuit to include the first and second PMOS transistors comprises defining an electrical connection between the n-well region and each of a first source/drain (S/D) terminal and a bulk terminal of each of the first and second PMOS transistors, and the arranging the plurality of conductive elements comprises:

arranging first power domain electrical connections to each of a second S/D terminal of the first PMOS transistor and a gate of the second PMOS transistor; and arranging second power domain electrical connections to each of a second S/D terminal of the second PMOS transistor and a gate of the first PMOS transistor.

3. The method of claim 2, wherein the first power domain is configured to have a first power supply voltage level, the second power domain is configured to have a second power supply voltage level, and either:

the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor.

4. The method of claim 1, wherein the configuring the bias circuit to include the first and second PMOS transistors comprises:

defining a first electrical connection between the n-well region and each of a first source/drain (S/D) terminal and a bulk terminal of each of the first and second PMOS transistors; and defining a second electrical connection between a gate of the first PMOS transistor and a first S/D terminal of each of a fifth PMOS transistor and an NMOS transistor defined in a substrate region outside the n-well region, and the arranging the plurality of conductive elements comprises:

arranging first power domain electrical connections to each of a second S/D terminal of the first PMOS transistor and a gate of each of the second PMOS transistor, the fifth PMOS transistor, and the NMOS transistor;

arranging second power domain electrical connections to a second S/D terminal of each of the second PMOS transistor and the fifth PMOS transistor; and arranging a reference voltage connection to a second S/D terminal of the NMOS transistor.

5. The method of claim 4, wherein the first power domain is configured to have a first power supply voltage level, the second power domain is configured to have a second power supply voltage level, and the first power supply voltage level is greater than the second power supply voltage level by an amount less than one or more threshold voltages of the first and second PMOS transistors.

6. The method of claim 1, wherein each of the first power domain and the second power domain is configured to operate in each of a power-on mode and a power-down mode.

7. The method of claim 1, further comprising:

storing the IC layout diagram comprising each of the first through fourth PMOS transistors, the n-well region, the plurality of conductive regions, and the plurality of conductive elements in a storage device.

8. A method of generating an integrated circuit (IC) layout diagram, the method comprising:

defining first through fourth PMOS transistors in an n-well region and first through third NMOS transistors in a substrate region outside the n-well region;

arranging a plurality of conductive regions whereby a bias circuit is configured to include the first and second PMOS transistors and a level shifter is configured to include the third and fourth PMOS transistors and the first through third NMOS transistors; and arranging a plurality of conductive elements whereby a first power domain includes electrical connections to each of the first and third PMOS transistors and a second power domain includes electrical connections to each of the second and fourth PMOS transistors.

9. The method of claim 8, wherein the configuring the bias circuit to include the first and second PMOS transistors comprises defining an electrical connection between the n-well region and each of a first source/drain (S/D) terminal and a bulk terminal of each of the first and second PMOS transistors, and the arranging the plurality of conductive elements comprises:

arranging first power domain electrical connections to each of a second S/D terminal of the first PMOS transistor, a gate of the second PMOS transistor, and a first S/D terminal of the third PMOS transistor; and arranging second power domain electrical connections to each of a second S/D terminal of the second PMOS transistor, a gate of the first PMOS transistor, and a first S/D terminal of the fourth PMOS transistor.

10. The method of claim 9, wherein the first power domain is configured to have a first power supply voltage level, the second power domain is configured to have a second power supply voltage level, and either:

the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor.

11. The method of claim 8, wherein the configuring the bias circuit to include the first and second PMOS transistors comprises:

defining a first electrical connection between the n-well region and each of a first source/drain (S/D) terminal and a bulk terminal of each of the first and second PMOS transistors; and defining a second electrical connection between a gate of the first PMOS transistor and a first S/D terminal of each of a fifth PMOS transistor and a fourth NMOS transistor defined in a substrate region outside the n-well region, and the arranging the plurality of conductive elements comprises:

arranging first power domain electrical connections to each of a second S/D terminal of the first PMOS transistor, a gate of each of the second PMOS transistor, the fifth PMOS transistor, and the NMOS transistor, and a first S/D terminal of the third PMOS transistor;

arranging second power domain electrical connections to a second S/D terminal of each of the second and fifth PMOS transistors and a first S/D terminal of the fourth PMOS transistor; and arranging reference voltage connections to a first S/D terminal of each of the first through third NMOS transistors and a second S/D terminal of the fourth NMOS transistor.

12. The method of claim 11, wherein the first power domain is configured to have a first power supply voltage level, the second power domain is configured to have a second power supply voltage level, and the first power supply voltage level is greater than the second power supply voltage level by an amount less than one or more threshold voltages of the first and second PMOS transistors.

13. The method of claim 8, wherein each of the first power domain and the second power domain is configured to operate in each of a power-on mode and a power-down mode.

14. The method of claim 8, further comprising: storing the IC layout diagram comprising each of the first through fourth PMOS transistors, the n-well region, the first through third NMOS transistors, the plurality of conductive regions, and the plurality of conductive elements in a storage device.

15. A method of generating an integrated circuit (IC) layout diagram, the method comprising:

defining first through fifth PMOS transistors in an n-well region;

arranging a plurality of conductive regions whereby a bias circuit is configured to include the first and second PMOS transistors and a level shifter is configured to include the third through fifth PMOS transistors;

arranging a plurality of conductive elements whereby a first power domain includes electrical connections to each of the first and third PMOS transistors and a second power domain includes electrical connections to each of the second, fourth, and fifth PMOS transistors; and storing the IC layout diagram comprising each of the first through fifth PMOS transistors, the n-well region, the plurality of conductive regions, and the plurality of conductive elements in a storage device.

16. The method of claim 15, wherein the configuring the bias circuit to include the first and second PMOS transistors comprises defining an electrical connection between the n-well region and each of a first source/drain (S/D) terminal and a bulk terminal of each of the first and second PMOS transistors, and the arranging the plurality of conductive elements comprises:

arranging first power domain electrical connections to each of a second S/D terminal of the first PMOS transistor, a gate of the second PMOS transistor, and a first S/D terminal of third PMOS transistor; and arranging second power domain electrical connections to each of a second S/D terminal of the second PMOS transistor, a gate of the first PMOS transistor, and a first S/D terminal of each of the fourth and fifth PMOS transistors.

17. The method of claim 16, wherein the first power domain is configured to have a first power supply voltage level, the second power domain is configured to have a second power supply voltage level, and either:

the first power supply voltage level is greater than the second power supply voltage level by an amount greater than a threshold voltage of the first PMOS transistor, or the second power supply voltage level is greater than the first power supply voltage level by an amount greater than a threshold voltage of the second PMOS transistor.

18. The method of claim 15, wherein the configuring the bias circuit to include the first and second PMOS transistors comprises:

defining a first electrical connection between the n-well region and each of a first source/drain (S/D) terminal and a bulk terminal of each of the first and second PMOS transistors; and defining a second electrical connection between a gate of the first PMOS transistor and a first S/D terminal of each of a sixth PMOS transistor and an NMOS transistor defined in a substrate region outside the n-well region, and the arranging the plurality of conductive elements comprises:

arranging first power domain electrical connections to each of a second S/D terminal of the first PMOS transistor, a gate of each of the second PMOS transistor, the sixth PMOS transistor, and the NMOS transistor, and a first S/D terminal of the third PMOS transistor;

arranging second power domain electrical connections to a second S/D terminal of each of the second PMOS transistor and the sixth PMOS transistor, and a first S/D terminal of each of the fourth and fifth PMOS transistors; and arranging a reference voltage connection to a second S/D terminal of the NMOS transistor.

19. The method of claim 18, wherein the first power domain is configured to have a first power supply voltage level, the second power domain is configured to have a second power supply voltage level, and a difference between the first power supply voltage level and the second power supply voltage level is less than one or more threshold voltages of the first and second PMOS transistors.

20. The method of claim 15, wherein
each of the first power domain and the second power
domain is configured to operate in each of a power-on
mode and a power-down mode.

\* \* \* \* \*